United States Patent [19]

Falconer et al.

[11] Patent Number: 5,204,874
[45] Date of Patent: Apr. 20, 1993

[54] METHOD AND APPARATUS FOR USING ORTHOGONAL CODING IN A COMMUNICATION SYSTEM

[75] Inventors: David D. Falconer, Nepean, Canada; Fuyun Ling, Jamaica Plain, Mass.

[73] Assignee: Motorola, Inc., Schaumburg, Ill.

[21] Appl. No.: 839,528

[22] Filed: Feb. 19, 1992

[51] Int. Cl.⁵ .............................................. H04K 1/00
[52] U.S. Cl. ......................................... 375/1; 380/28
[58] Field of Search .................. 375/1; 380/28, 49, 33

[56] References Cited

U.S. PATENT DOCUMENTS

| | | | |
|---|---|---|---|
| 4,208,739 | 6/1980 | Lu et al. | 375/2 |
| 4,811,357 | 3/1989 | Betts et al. | |
| 4,896,353 | 1/1990 | Dehgani et al. | 380/28 |
| 4,901,307 | 2/1990 | Gilhousen et al. | |
| 5,054,066 | 10/1991 | Riek et al. | 380/30 |
| 5,056,105 | 10/1991 | Darmon et al. | |
| 5,101,501 | 3/1992 | Gilhousen et al. | |
| 5,103,459 | 4/1992 | Gilhousen et al. | |

OTHER PUBLICATIONS

Dixon, Robert C., *Spread Spectrum Systems* 2nd Ed., John Wiley & Sons, New York, NY, 1984 Chapters 1 & 2, pp. 1-55.

Sklar, Bernard, *Digital Communications: Fundamentals and Applications*, Prentice Hall, Englewood Cliffs, N.J., 1988, Chapters 5 & 6 pp. 245-380.

"Two Classes of Convolutional Codes Over GF(q) for q-ary Orthogonal Signaling", William E. Ryan and Stephen G. Wilson, *IEEE Transactions on Communications*, vol. 39, No. 1 (Jan. 1988), pp. 30-40.

"On the System Design Aspects of Code Division Multiple Access (CDMA) Applied to Digital Cellular and Personal Communications Networks", Allen Salmasi and Klein S. Gilhousen, *Proceedings of 41st Vehicular Technology Conference* in St. Louis, Mo., May 19-22, 1991, pp. 57-62.

"Performance of Convolutional Codes with Interleaving in the Interference Limited Rayleigh Fading Channel", Li Fung Chang and Sirikiat Ariyavisitakul, *Proceedings of 41st Vehicular Technology Conference* in St. Louis, Mo., May 19-22, 1991, pp. 812-816.

*Primary Examiner*—David Cain
*Attorney, Agent, or Firm*—Shawn Dempster

[57] ABSTRACT

A method and apparatus is provided for encoding and decoding. In encoding, bits (202) are encoded (204) into symbols (206) such that maximum likelihood decoding is facilitated. Groups of symbols (206) are translated by either interleaving by group each group within a block (208) and subsequently deriving an orthogonal code from each group (212) or deriving an orthogonal code from each group and subsequently interleaving by code each code within a block. In decoding, groups of samples (228, 229) are transformed by either generating metrics and index symbols (242) for each group of samples (232, 234, 236, 238, 240) and subsequently deinterleaving by group each group of metrics within a block (244) or deinterleaving by group each group of samples within a block and subsequently generating metrics and index symbols for each deinterleaved group of samples. Each metric represents the confidence that a group of samples is a particular orthogonal code. Subsequently, maximum likelihood decoding (266) generates an estimated bit (268) from the index symbols and metrics (260).

25 Claims, 4 Drawing Sheets

FIG. 1 —PRIOR ART—

| (1),(2) | (33),(34) | (65),(66) | (97),(98) | (129),(130) | (161),(162) |
|---|---|---|---|---|---|
| (3),(4) | (35),(36) | (67),(68) | (99),(100) | (131),(132) | (163),(164) |
| (5),(6) | (37),(38) | (69),(70) | (101),(102) | (133),(134) | (165),(166) |
| (7),(8) | (39),(40) | (71),(72) | (103),(104) | (135),(136) | (167),(168) |
| (9),(10) | (41),(42) | (73),(74) | (105),(106) | (137),(138) | (169),(170) |
| (11),(12) | (43),(44) | (75),(76) | (107),(108) | (139),(140) | (171),(172) |
| (13),(14) | (45),(46) | (77),(78) | (109),(110) | (141),(142) | (173),(174) |
| (15),(16) | (47),(48) | (79),(80) | (111),(112) | (143),(144) | (175),(176) |
| (17),(18) | (49),(50) | (81),(82) | (113),(114) | (145),(146) | (177),(178) |
| (19),(20) | (51),(52) | (83),(84) | (115),(116) | (147),(148) | (179),(180) |
| (21),(22) | (53),(54) | (85),(86) | (117),(118) | (149),(150) | (181),(182) |
| (23),(24) | (55),(56) | (87),(88) | (119),(120) | (151),(152) | (183),(184) |
| (25),(26) | (57),(58) | (89),(90) | (121),(122) | (153),(154) | (185),(186) |
| (27),(28) | (59),(60) | (91),(92) | (123),(124) | (155),(156) | (187),(188) |
| (29),(30) | (61),(62) | (93),(94) | (125),(126) | (157),(158) | (189),(190) |
| (31),(32) | (63),(64) | (95),(96) | (127),(128) | (159),(160) | (191),(192) |

METHOD AND APPARATUS FOR USING ORTHOGONAL CODING IN A COMMUNICATION SYSTEM

FIELD OF THE INVENTION

The present invention relates to communication systems which employ spread-spectrum signals and, more particularly, to a method and apparatus for convolutional orthogonal coding in a spread spectrum communication system.

BACKGROUND OF THE INVENTION

Communication systems take many forms. In general, the purpose of a communication system is to transmit information-bearing signals from a source, located at one point, to a user destination, located at another point some distance away. A communication system generally consists of three basic components: transmitter, channel, and receiver. The transmitter has the function of processing the message signal into a form suitable for transmission over the channel. This processing of the message signal is referred to as modulation. The function of the channel is to provide a physical connection between the transmitter output and the receiver input. The function of the receiver is to process the received signal so as to produce an estimate of the original message signal. This processing of the received signal is referred to as demodulation.

Two types of two-way communication channels exist, namely, point-to point channels and point-to-multipoint channels. Examples of point-to-point channels include wirelines (e.g., local telephone transmission), microwave links, and optical fibers. In contrast, point-to-multipoint channels provide a capability where many receiving stations may be reached simultaneously from a single transmitter (e.g. cellular radio telephone communication systems). These point-to-multipoint systems are also termed Multiple Address Systems (MAS).

Analog and digital transmission methods are used to transmit a message signal over a communication channel. The use of digital methods offers several operational advantages over analog methods, including but not limited to: increased immunity to channel noise and interference, flexible operation of the system, common format for the transmission of different kinds of message signals, improved security of communication through the use of encryption, and increased capacity.

These advantages are attained at the cost of increased system complexity. However, through the use of very large-scale integration (VLSI) technology a cost-effective way of building the hardware has been developed.

To transmit a message signal (either analog or digital) over a band-pass communication channel, the message signal must be manipulated into a form suitable for efficient transmission over the channel. Modification of the message signal is achieved by means of a process termed modulation. This process involves varying some parameter of a carrier wave in accordance with the message signal in such a way that the spectrum of the modulated wave matches the assigned channel bandwidth. Correspondingly, the receiver is required to recreate the original message signal from a degraded version of the transmitted signal after propagation through the channel. The recreation is accomplished by using a process known as demodulation, which is the inverse of the modulation process used in the transmitter.

In addition to providing efficient transmission, there are other reasons for performing modulation. In particular, the use of modulation permits multiplexing, that is, the simultaneous transmission of signals from several message sources over a common channel. Also, modulation may be used to convert the message signal into a form less susceptible to noise and interference.

For multiplexed communication systems, the system typically consists of many remote units (i.e. subscriber units) which require active service over a communication channel for a short or discrete portion of the communication channel resource rather than continuous use of the resources on a communication channel. Therefore, communication systems have been designed to incorporate the characteristic of communicating with many remote units for brief intervals on the same communication channel. These systems are termed multiple access communication systems.

One type of multiple access communication system is a spread spectrum system. In a spread spectrum system, a modulation technique is utilized in which a transmitted signal is spread over a wide frequency band within the communication channel. The frequency band is much wider than the minimum bandwidth required to transmit the information being sent. A voice signal, for example, can be sent with amplitude modulation (AM) in a bandwidth only twice that of the information itself. Other forms of modulation, such as low deviation frequency modulation (FM) or single sideband AM, also permit information to be transmitted in a bandwidth comparable to the bandwidth of the information itself. However, in a spread spectrum system, the modulation of a signal to be transmitted often includes taking a baseband signal (e.g., a voice channel) with a bandwidth of only a few kilohertz, and distributing the signal to be transmitted over a frequency band that may be many megahertz wide. This is accomplished by modulating the signal to be transmitted with the information to be sent and with a wideband encoding signal.

Three general types of spread spectrum communication techniques exist, including:

Direct Sequence

The modulation of a carrier by a digital code sequence whose bit rate is much higher than the information signal bandwidth. Such systems are referred to as "direct sequence" modulated systems.

Hopping

Carrier frequency shifting in discrete increments in a pattern dictated by a code sequence. These systems are called "frequency hoppers." The transmitter jumps from frequency to frequency within some predetermined set; the order of frequency usage is determined by a code sequence. Similarly "time hopping" and "time-frequency hopping" have times of transmission which are regulated by a code sequence.

Chirp

Pulse-FM or "chirp" modulation in which a carrier is swept over a wide band during a given pulse interval.

Information (i.e. the message signal) can be embedded in the spread spectrum signal by several methods. One method is to add the information to the spreading code before it is used for spreading modulation. This technique can be used in direct sequence and frequency hopping systems. It will be noted that the information being sent must be in a digital form prior to adding it to the spreading code, because the combination of the spreading code and the information typically a binary code involves module-2 addition. Alternatively, the information or message signal may be used to modulate a carrier before spreading it.

Thus, a spread spectrum system must have two properties: (1) the transmitted bandwidth should be much greater than the bandwidth or rate of the information being sent and (2) some function other than the information being sent is employed to determine the resulting modulated channel bandwidth.

Spread spectrum communication systems can be multiple access systems communication systems. One type of multiple access spread spectrum system is a code division multiple access (CDMA) system. In a CDMA system, communication between two communication units is accomplished by spreading each transmitted signal over the frequency band of the communication channel with a unique user spreading code. As a result, transmitted signals are in the same frequency band of the communication channel and are separated only by unique user spreading codes. These unique user spreading codes preferably are orthogonal to one another such that the cross-correlation between the spreading codes is approximately zero. CDMA systems may use direct sequence or frequency hopping spreading techniques. Particular transmitted signals can be retrieved from the communication channel by despreading a signal representative of the sum of signals in the communication channel with a user spreading code related to the particular transmitted signal which is to be retrieved from the communication channel. Further, when the user spreading codes are orthogonal to one another, the received signal can be correlated with a particular user spreading code such that only the desired user signal related to the particular spreading code is enhanced while the other signals for all of the other users are not enhanced.

It will be appreciated by those skilled in the art that several different spreading codes exist which can be used to separate data signals from one another in a CDMA communication system. These spreading codes include but are not limited to pseudonoise (PN) codes and Walsh codes. A Walsh code corresponds to a single row or column of the Hadamard matrix. For example, in a 64 channel CDMA spread spectrum system, particular mutually orthogonal Walsh codes can be selected from the set of 64 Walsh codes within a 64 by 64 Hadamard matrix. Also, a particular data signal can be separated from the other data signals by using a particular Walsh code to spread the particular data signal.

Further it will be appreciated by those skilled in the art that spreading codes can be used to channel code data signals. The data signals are channel coded to improve performance of the communication system by enabling transmitted signals to better withstand the effects of various channel impairments, such as noise, fading, and jamming. Typically, channel coding reduces the probability of bit error, and/or reduces the required signal to noise ratio usually expressed as energy per bit divided by noise density ($E_b/N_0$), to recover the signal at the cost of expanding more bandwidth than would otherwise be necessary to transmit the data signal. For example, Walsh codes can be used to channel code a data signal prior to modulation of the data signal for subsequent transmission. Similarly PN spreading codes can be used to channel code a data signal.

A typical spread spectrum transmission involves expanding the bandwidth of an information signal, transmitting the expanded signal and recovering the desired information signal by remapping the received spread spectrum into the original information signals bandwidth. This series of bandwidth trades used in spread spectrum signaling techniques allows a communication system to deliver a relatively error-free information signal in a noisy signal environment or communication channel. The quality of recovery of the transmitted information signal from the communication channel is measured by the error rate (i.e., the number of errors in the recovery of the transmitted signal over a particular time span or received bit span) for some $E_b/N_0$. As the error rate increases the quality of the signal received by the receiving party decreases. As a result, communication systems typically are designed to limit the error rate to an upper bound or maximum so that the degradation in the quality of the received signal is limited. In CDMA spread spectrum communication systems, the error rate is related to the noise interference level in the communication channel which is directly related to number of simultaneous but code divided users within the communication channel. Thus, in order to limit the maximum error rate, the number of simultaneous code divided users in the communication channel is limited. However, the error rate can be reduced by using channel coding schemes. Therefore, by using channel coding schemes the number of simultaneous users in a communication channel can be increased while still maintaining the same maximum error rate limit.

As discussed in *Digital Communications: Fundamentals and Applications* by Bernard Sklar, published by Prentice Hall, Englewood Cliffs, N.J. in 1988, especially chapters 5 and 6 entitled "Channel Coding" found on pages 245–380, several of these channel coding schemes have been developed for use in communication systems. However, a need exists for these channel coding schemes to be specifically optimized for use in CDMA spread spectrum communication systems. Through the use of these optimized channel coding schemes, the number of simultaneous users in a communication channel can be increased over the number of simultaneous users in a communication channel using non-optimized channel coding while maintaining the same maximum error rate limit.

SUMMARY OF THE INVENTION

A method and apparatus is provided for using orthogonal codes in encoding and decoding in a communication system. In encoding, input bits of a data signal are encoded into data symbols and the data symbols are grouped. The data symbols are encoded with an encoding algorithm (e.g., a block coding algorithm or a convolutional coding algorithm) which facilitates subsequent maximum likelihood decoding of the data symbols into estimated data bits. The groups of data symbols are translated according to either one of two algorithms. The first algorithm consists of interleaving by group each group of data symbols within a predetermined size block and subsequently deriving an orthogonal code from each group of interleaved data symbols. The alternative second algorithm consists of deriving an orthogonal code from each group of data symbols and subsequently interleaving by orthogonal code each orthogonal code within a predetermined size block.

In decoding, received data samples are grouped. The groups of data samples are transformed according to either one of two algorithms. The first algorithm consists of generating a plurality of soft decision similarity metrics and index data symbols for each group of data samples such that one soft decision metric is associated with each index data symbol and subsequently deinterleaving by group each group of soft decision metrics within a predetermined size block. The alternative second algorithm consists of deinterleaving by group each group of data samples within a predetermined size block and subsequently generating a plurality of soft decision similarity metrics and index data symbols for each deinterleaved group of data samples such that one soft decision metric is associated with each index data symbol. Each soft decision metric corresponds to a measure of confidence that a particular group of data samples is substantially similar to a particular orthogonal code from within a set of mutually orthogonal codes. After the grouped samples are transformed, at least one estimated data bit is generated by utilizing maximum likelihood decoding techniques to derive the at least one estimated data bit from the index data symbols and associated soft decision metrics.

DETAILED DESCRIPTION

Figure 1:
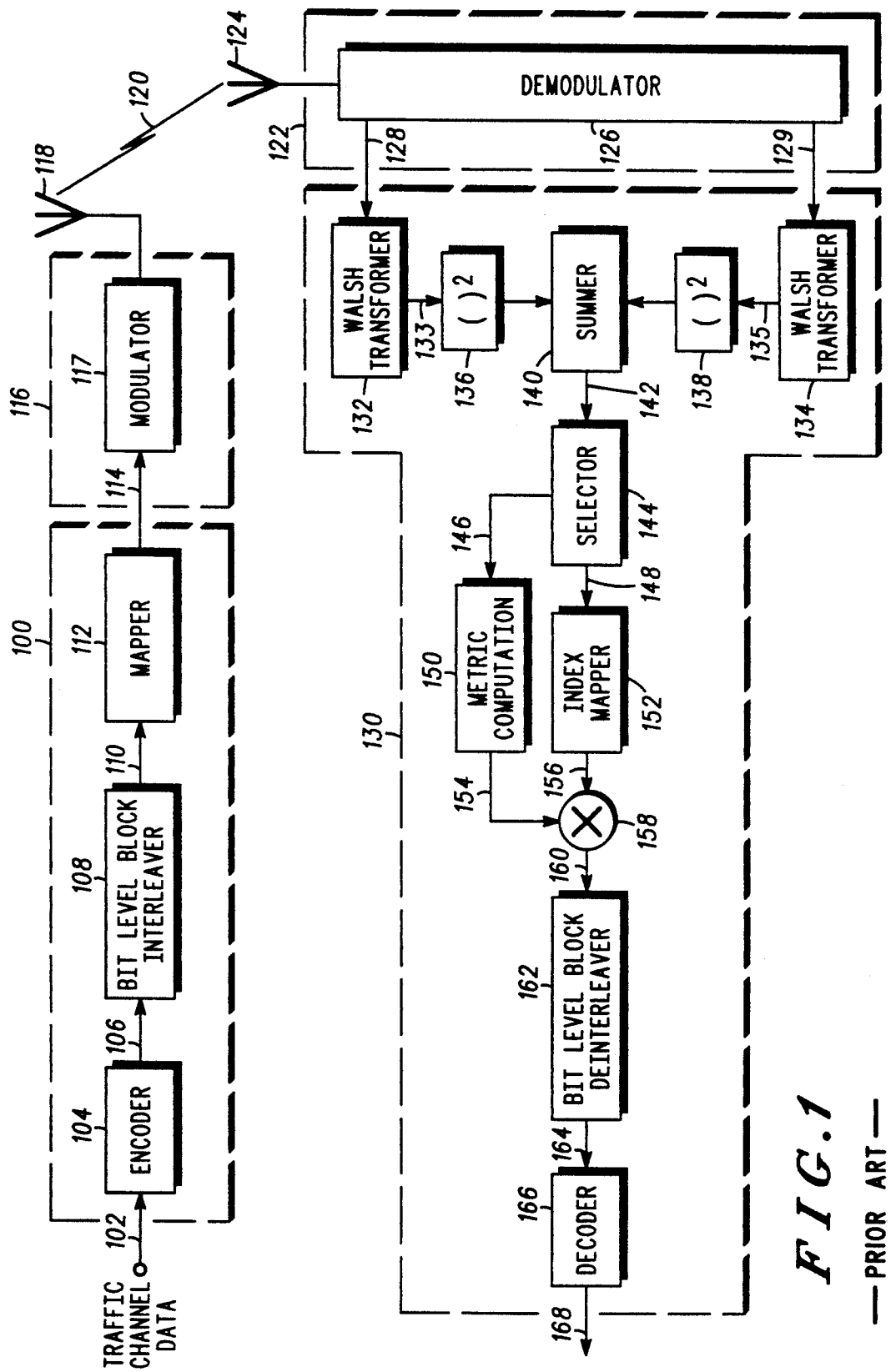
FIG. 1 is a block diagram showing a prior art communication system which uses orthogonal coding.

Referring now to FIG. 1, a prior art system for using orthogonal codes in encoding and decoding in a communication system is shown. In the encoding portion 100 of the communication system, traffic channel data bits 102 are input to an encoder 104 at a particular bit rate (e.g., 9.6 kbit/second). The input traffic channel data bits can include either voice converted to data by a vocoder, pure data, or a combination of the two types of data. Encoder 104 encodes the input data bits 102 into data symbols at a fixed encoding rate with an encoding algorithm which facilitates subsequent maximum likelihood decoding of the data symbols into data bits (e.g. convolutional or block coding algorithms). For example, encoder 104 encodes input data bits 102 (received at a rate of 9.6 kbits/second) at a fixed encoding rate of one data bit to three data symbols (i.e., ⅓) such that the encoder 102 outputs data symbols 106 at a 28.8 ksymbols/second rate.

The data symbols 106 are then input into an interleaver 108. Interleaver 108 block interleaves the input data symbols 106 at the symbol level. In the interleaver 108, the data symbols are individually input into a matrix which defines a predetermined size block of data symbols. The data symbols are input into locations within the matrix so that the matrix is filled in a column by column manner. The data symbols are individually output from locations within the matrix so that the matrix is emptied in a row by row manner. Typically, the matrix is a square matrix having a number of rows equal to the number of columns; however, other matrix forms can be chosen to increase the output interleaving distance between the consecutively input non-interleaved data symbols. The interleaved data symbols 110 are output by the interleaver 108 at the same data symbol rate that they were input (e.g., 28.8 ksymbols/second). The predetermined size of the block of data symbols defined by the matrix is derived from the maximum number of data symbols which can be transmitted at a predetermined chip rate within a predetermined length transmission block. For example, if data symbols 106 are output from the encoder 104 at a 28.8 ksymbols/second rate, then the maximum predetermined chip rate for transmitting those data symbols 106 is 28.8 ksymbols/second. Further, for example if the predetermined length of the transmission block is 20 milliseconds, then the predetermined size of the block of data symbols is 28.8 ksymbols/second times 20 milliseconds which equals 576 data symbols which defines a 18 by 32 matrix.

The interleaved data symbols 110 are then input to a mapper 112. The mapper 112 derives a sequence of fixed length orthogonal codes 114 (e.g., 64-ary Walsh codes) from the interleaved data symbols 110. In for example 64-ary orthogonal code signaling, the interleaved data symbols 110 are grouped into sets of six to select one out of the 64 orthogonal codes to represent the set of six data symbols. These 64 orthogonal codes preferably correspond to Walsh codes from a 64 by 64 Hadamard matrix wherein a Walsh code is a single row or column of the matrix. The mapper 112 outputs a sequence of Walsh codes 114 which correspond to the input data symbols 110 at a fixed symbol rate (e.g., 307.2 ksymbols/second).

The sequence of Walsh codes 114 is output from encoding portion 100 of the communication system and input to a transmitting portion 116 of the communication system. The sequence 114 is prepared for transmission over a communication channel by a modulator 117. Subsequently, the modulated sequence is provided to an antenna 118 for transmission over the communication channel 120.

The modulator 117 preferably prepares the sequence 114 for direct sequence code divided spread spectrum transmission by spreading the sequence 114 with a long spreading code (e.g. PN code). The spreading code is a user specific sequence of symbols or unique user code which is output at a fixed chip rate (e.g., 1.228 Mchips/second). In addition to providing an identification as to which user sent the encoded traffic channel data bits 102 over the communication channel 120, the unique user code enhances the security of the communication in the communication channel by scrambling the encoded traffic channel data bits 102. In addition, the user code spread encoded data bits (i.e. data symbols) are spread by a pair of short spreading codes (i.e. short when compared to the long spreading code) to generate an I-channel and Q-channel code spread sequence. The I-channel and Q-channel code spread sequences are used to bi-phase modulate a quadrature pair of sinusoids by driving the power level controls of the pair of sinusoids. The sinusoids output signals are summed, bandpass filtered, translated to an RF frequency, amplified, filtered and radiated by an antenna 118 to complete transmission of the traffic channel data bits 102 in a communication channel 120.

A receiving portion 122 of the communication system receives the transmitted spread spectrum signal from over the communication channel 120 through antenna 124. The received signal is sampled into data samples by demodulator 126. Subsequently, the data samples 128 and 129 are output to the decoding portion 130 of the communication system.

The demodulator 126 preferably samples the received spread spectrum signal by filtering, demodulating, translating from the RF frequencies, and sampling at a predetermined rate (e.g., 1.2288 Msamples/second). Subsequently, the in-phase sampled signal and quadrature sampled signal are independently despread by correlating the received sampled signals with the short spreading codes and the long spreading code. The resulting despread in-phase 128 and quadrature 129 sampled signals are sampled a predetermined rate (e.g., 307.2 ksamples/second so that a sequence of four samples of the received spread spectrum signal is despread and/or represented by a single data sample).

The in-phase 128 and quadrature 129 sampled signals are independently input to a decoding portion 130 of the communication system which non-coherently detects/-decodes the sampled signals 128 and 129 into estimated data bits 168. In order to decode the sampled signals 128 and 129, predetermined length groups (e.g., 64 sample length groups) of sampled signals are independently input to orthogonal code transformers (e.g., fast Hadamard transformers) 132 and 134, respectively. The orthogonal code transformers 132 and 134 output a plurality of transformer output signals 133 and 135, respectively (e.g. when 64 sample length groups are input, then 64 transformer output signals are generated). Each transformer output signal corresponds to a measure of confidence that a particular group of sampled signals corresponds to a particular orthogonal code from within a set of mutually orthogonal codes. In addition, each transformer output signal has an associated index data symbol which indicates which particular orthogonal code from within a set of mutually orthogonal codes that the transformer output signal corresponds to (e.g. when 64 sample length groups are input, then a 6 bit length index data symbol can be associated with the transformer output signal to indicate the particular 64 bit length orthogonal code to which the transformer output signal corresponds). Subsequently, each transformer output signal within the groups of transformer output signals 133 and 135 is squared by transformer output signal squaring mechanisms 136 and 138, respectively. Subsequently, a group of decision values 142 is generated (e.g. when 64 transformer output signals are generated, then 64 decision values are generated) by adding mechanism 140 which adds together each pair of squared transformer output signals (i.e. one from each of the transformer output signal squaring mechanisms 136 and 138) having associated index data symbols which indicate that the transformer output signals correspond to the same orthogonal code.

The group of decision values 142 and associated index data symbols are input to a selection mechanism 144 which selects the maximum decision value from the group of decision values 142. The selected decision value 146 is input to a metric computation mechanism 150 which scales the selected decision value to a value 154 which can be used as a scaling factor in forming individual soft decision data which can subsequently be used in forming soft decision transition metrics for maximum likelihood decoding techniques. The index data symbol associated with the selected decision value 148 is input to an index mapping mechanism 152 which maps the index data symbol into a plurality of ±1 soft decision bits 156 (e.g., a 6 bit length index data symbol maps into 6 soft decision bits). Multiplier 158 multiplies each of the plurality of ±1 soft decision bits 156 by the scaling factor 154 to form an individual soft decision data 160 for each soft decision bit (e.g., 6 soft decision bits form 6 individual soft decision data). The individual soft decision data are formed at a predetermined rate related to the number of metrics formed per group of data samples and the rate that the data samples are input to the orthogonal transformer (e.g., if the data samples are input at 307.2 ksamples/second and 6 individual data are formed/64 data samples, then the individual soft decision data are formed at 28.8 kmetrics/second).

The individual soft decision data 160 are then input into a deinterleaver 162 which deinterleaves the input soft decision data 160 at the individual data level. In the deinterleaver 162, the soft decision data are individually input into a matrix which defines a predetermined size block of soft decision data. The soft decision data are input into locations within the matrix so that the matrix is filled in a row by row manner. The deinterleaved soft decision data 164 are individually output from locations within the matrix so that the matrix is emptied in a column by column manner. The deinterleaved soft decision data 164 are output by the deinterleaver 162 at the same rate that they were input (e.g., 28.8 kmetrics/second).

The predetermined size of the block of soft decision data defined by the matrix is derived from the maximum rate of sampling data samples from the spread spectrum signal received within the predetermined length transmission block, the number of data samples represented by each group of data samples, bit length of the index data symbol associated with the soft decision value selected for each group of data samples input to the orthogonal code transformer, and the number of soft decision data formed from the selected soft decision value and associated index data symbol. For example, if the maximum rate of sampling data samples from the received spread spectrum signal is 307,200 data samples/second, the predetermined length of the transmission block is 20 milliseconds, the bit length of the selected index data symbol per group of data samples is 6 bits/index data symbol associated with a group of 64 samples, and the number of soft decision data formed per index data symbol is 6 individual data/index data symbol, then the predetermined size of the block of soft decision data is 307,200 samples/second times 20 milliseconds times 6 bit index data symbol/index data symbol times one index data symbol/64 samples times 6 individual data/ 6 bit index data symbol which equals 576 soft decision data.

The deinterleaved soft decision data 164, are input to a decoder 166 which uses maximum likelihood decoding techniques to generate estimated traffic channel data bits 168. The maximum likelihood decoding techniques may be augmented by using an algorithm which is substantially similar to a Viterbi decoding algorithm. The decoder 166 uses a group of the individual soft decision data 164 to form a set of soft decision transition metrics for use at each particular time state of the maximum likelihood sequence estimation decoder 166. The number of soft decision data 164 in the group used to form each set of soft decision transition metrics corresponds to the number of data symbols 106 at the output of the convolutional encoder 104 generated from each input data bit 102. The number of soft decision transition metrics in each set is equal to two raised to the power of the number of soft decision data 164 in each group. For example, when a ⅓ convolutional encoder is used in the transmitter, three data symbols 106 are generated from each input data bit 102. Thus, decoder 166 uses groups of three individual soft decision data 164 to form eight soft decision transition metrics for use at each time state in the maximum likelihood sequence estimation decoder 166. The estimated data bits 168 are generated at a rate related to the rate that the soft decision data 164 are input to the decoder 166 and the fixed rate used to originally encode the input data bits 102 (e.g., if the soft decision data are input at 28.8 kmetrics/second and the original encoding rate was ⅓ then estimated data bits 168 are output at a rate of 9600 bits/second).

Thus, a communication system for using orthogonal codes in encoding and decoding has been described above with reference to FIG. 1. In summary, the communication system includes a first portion which encodes input data bits into data symbols, interleaves the data symbols in a symbols by symbol manner, maps the interleaved symbols into orthogonal codes, modulates and transmits the orthogonal codes over a communication channel. The communication system further includes a second portion which receives and demodulates a signal from over the communication channel, transforms groups of samples of the demodulated signal into a group of measures of confidence that each particular group of samples corresponds to a particular orthogonal code from within a set of mutually orthogonal codes, selecting the one largest measure of confidence from each group of measures of confidence and an index data symbol which identifies the particular orthogonal code corresponding to the selected measure of confidence, generating soft decision data from each selected measure of confidence and associated index data symbol, deinterleaving the soft decision data within each received transmission block, subsequently generating soft decision transition metrics from groups of deinterleaved individual soft decision data, and subsequently generating estimated data bits from the soft decision metrics by using maximum likelihood decoding techniques.

Figure 2:
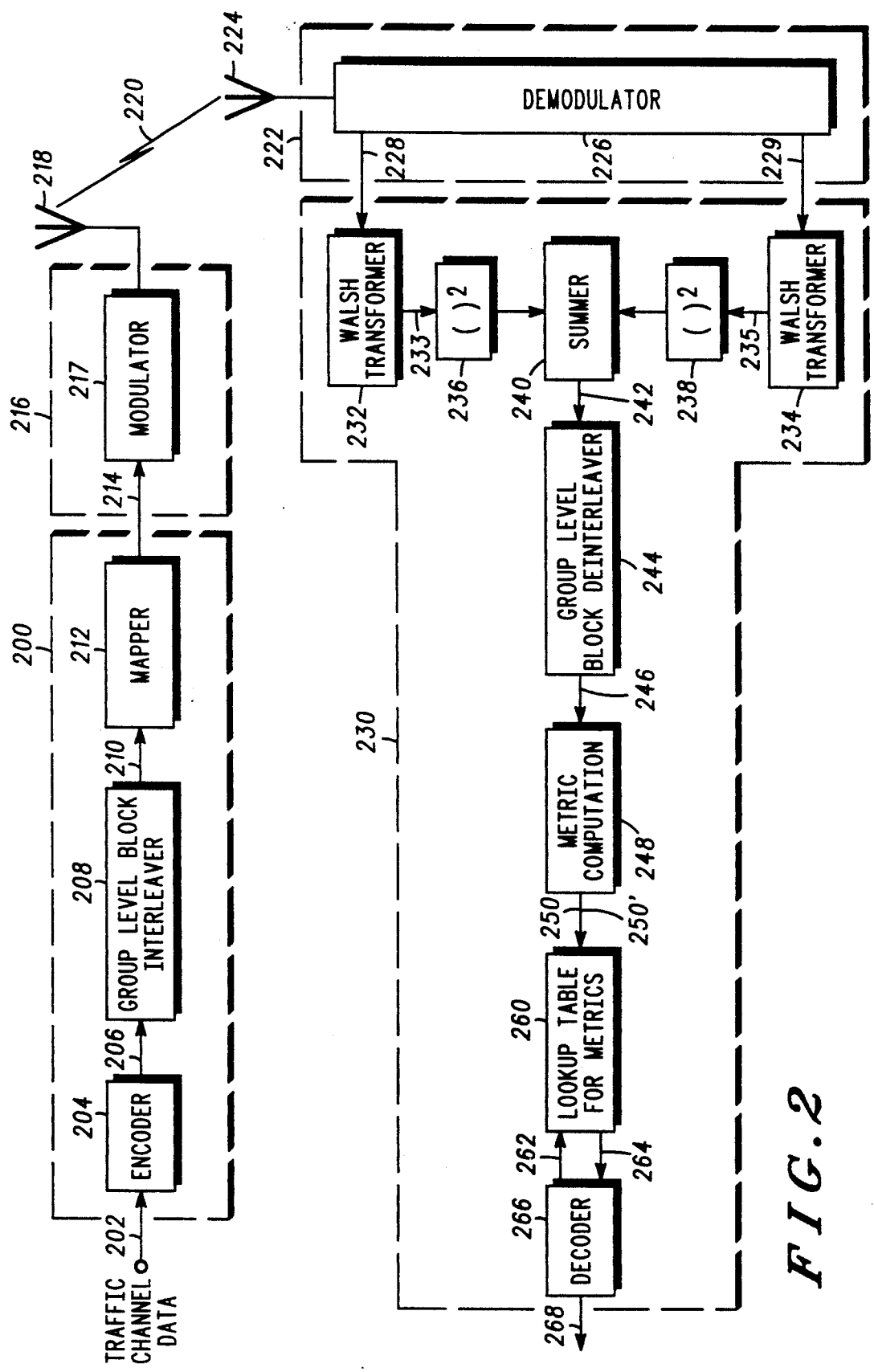
FIG. 2 is a block diagram showing a preferred embodiment communication system which uses orthogonal coding.

Referring now to FIG. 2, a preferred embodiment system for using orthogonal codes in encoding and decoding in a communication system is shown. The preferred embodiment system differs from the communication system shown in FIG. 1 by optimizing the encoding techniques previously described above for use with orthogonal codes. In particular, when the length of the orthogonal codes to be used in encoding data bits prior to transmission over a communication channel is known, then significant improvements in the overall performance of the communication system can be achieved. More specifically, the maximum likelihood sequence estimation (MLSE) decoding algorithm can be optimized by optimizing the encoding portion 200 of the communication system as well as the front end of the decoding portion 230.

In optimizing the communication system encoding portion 200 and decoding portion 230 with respect to the MLSE decoding algorithm, one starting point is analyzing the implementation of the MLSE decoding algorithm to the particular environment to which it is to be used. For the purposes of this discussion, the environment will include convolutional encoders and mapping the encoded bits to Walsh codes prior to transmission. It will be appreciated by those skilled in the art that these principles can be applied to other encoding techniques such as block encoding as well as mapping the encoded bits to other kinds of mutually orthogonal codes. In order to design a convolutional decoder to perform optimal MLSE decoding, the likelihood expression of the transitions must be derived. According to the theory of maximum likelihood estimation, for a received signal vector x, the likelihood function of the i-th transition is equal to the conditional probability of vector x being generated by the i-th Walsh code $w_i$ associated with the i-th transition. For an MLSE decoder, the optimal soft decision transition metric is equivalent to the logarithm of the likelihood function.

For the purposes of this discussion, the communication system is assumed to be non-fading and to have white, Gaussian noise with a variance $\sigma^2$. However, this following derivations can be easily extended by one skilled in the art to non-Gaussian noise. In a coherent detection scheme, the joint probability density function (pdf) of the coherently received vector x, given $w_i$ is sent, can be expressed as:

$$p(x|w_i) = \frac{1}{(2\pi\sigma^2)^{N/2}} \exp\left[\frac{-(x - aw_i)^H(x - aw_i)}{2\sigma^2}\right] \quad (eq.\ 1)$$

where $a$ is the channel attenuation and the superscript $^H$ indicates the complex conjugating and transposition, or Hermitian, operation of a vector or matrix and N is the dimension of the vector (i.e. for this example N=64 for a 64-Walsh code).

By taking the natural logarithm of (eq. 1) and after expanding, the optimal metric can be expressed as:

$$\text{Ln}[p(x|w_i)] = -\frac{N}{2} \text{Ln}[2\pi\sigma^2] + \frac{x^T x - 2ax^T w_i + a^2 w_i^T w_i}{2\sigma^2} \quad (eq.\ 2)$$

where, since both x and $w_i$ are real, we have replaced the Hermitian operation ($^H$) by a transpose operation ($^T$). All the terms except $-2ax^T w_i/2\sigma^2$ in (eq. 2) are common to all the transitions. Therefore, the optimum metric is simply $-ax^T w_i/\sigma^2$. Further, $x^T w_i$ is the correlation between the received signal vector and the i-th Walsh code (i.e. the i-th output of the Walsh transformer). Therefore, the optimal metric for the i-th transition is the scaled form of the i-th output of the Walsh transformer.

In a non-coherent detection scheme, the joint probability density function (pdf) of the non-coherently received vector x, given $w_i$ is sent and the modulation angle is $\theta$, can be expressed as:

$$p(x|w_i, \theta) = \frac{1}{(2\pi\sigma^2)^{N/2}} \exp\left[\frac{(-x - ae^{j\theta}w_i)^H(x - ae^{j\theta}w_i)}{2\sigma^2}\right] \quad (eq.\ 3)$$

where the received signal vector is a complex vector. Since $\theta$ is a random angle with a uniform distribution from 0 to $2\pi$, it can be eliminated from the equation by integrating the equation over the range $[0, 2\pi]$. More precisely, $$p(x|w_i) = \int_0^{2\pi} \frac{1}{(2\pi\sigma^2)^{N/2}} \exp\left[\frac{(-x - ae^{j\theta}w_i)^H(x - ae^{j\theta}w_i)}{2\sigma^2}\right]d\theta = \quad \text{(eq. 4)}$$

$$\frac{1}{(2\pi\sigma^2)^{N/2}} \exp\left[\frac{-(x^H x + a^2 w_i^T w_i)}{2\sigma^2}\right] \int_0^{2\pi} \exp\left[\frac{-(ae^{j\theta}x^H w_i + ae^{-j\theta}w_i^T x)}{2\sigma^2}\right]d\theta =$$

$$\frac{1}{(2\pi\sigma^2)^{N/2}} \exp\left[\frac{-(x^H x + a^2 w_i^T w_i)}{2\sigma^2}\right] \int_0^{2\pi} \exp\left[\frac{-a|x^H w_i|}{2\sigma^2}\cos(\theta + \phi)\right]d\theta$$

where $x^H w_i$ is expressed as $|x^H w_i|\cos(\phi)$.

Since $\cos(\theta + \phi)$ is a periodic function of $\theta$ with a period of $2\pi$ and further by use of the definition of $I_0(z)$, as the zero-th order modified Bessel function, the integral portion of (eq. 4) can be expressed as:

$$\int_0^{2\pi} \exp\left[\frac{-a|x^H w_i|}{2\sigma^2}\cos(\theta + \phi)\right]d\theta = \quad \text{(eq. 5)}$$

$$\int_0^{2\pi} \exp\left[\frac{-a|x^H w_i|}{2\sigma^2}\cos(\theta)\right]d\theta = \frac{2}{\pi} I_0\left(\frac{a|x^H w_i|}{\sigma^2}\right)$$

By substituting the result of (eq. 5) into (eq. 4) for the integral portion of (eq. 4), taking the natural logarithm of this version of (eq. 4), and eliminating the common terms for all of the transitions, the optimal metric can be expressed as:

$$\text{Ln}\left[I_0\left(\frac{a|x^H w_i|}{\sigma^2}\right)\right]. \quad \text{(eq. 6)}$$

However, $I_0(z)$ (i.e., the zero-th order modified Bessel function) can be expressed as $I_0(z) = e^z g(z)$, where $g(z)$ is a monotonically decreasing function with $g(0) = 1$ and $g(z) \approx 0.4/\sqrt{z}$ for $z \gg 1$. Thus, the optimal metric of (eq. 6) can be expressed as:

$$\text{Ln}\left[I_0\left(\frac{a|x^H w_i|}{\sigma^2}\right)\right] = \frac{a|x^H w_i|}{\sigma^2} + \text{Ln}\left[g\left(\frac{a|x^H w_i|}{\sigma^2}\right)\right]. \quad \text{(eq. 7)}$$

The second term of (eq. 7) can not be easily computed. Therefore, an approximation must be used to compute the optimal metric. One approximation is to simply use the first term (i.e. the scaled envelope of the Walsh transformer output. Another approximation which avoids a square-root operation is to use the squared value or compute the approximation of the magnitude of a complex number as the decoding metric. Yet another approximation is to segmentally approximate the function $g(z)$ by using polynomial equations. Upon experimentation with each of these different approximations in the non-coherent environment described above, the difference between using the squared value approximation and the segmented polynomial approximation in error rate performance was determined to be only one to two percent. This difference was deemed to be not significant enough in the preferred embodiment communication system environment to justify the extra computational complexity of segmented polynomial approximations. Therefore, in the preferred embodiment communication systems, the optimal metric is approximated as a scaled form of the squared value output by the Walsh code transformer.

This optimal soft decision transition metric for MLSE decoding differs from the metric generated in the communication system shown in FIG. 1 in that this optimal transition metric, as computed for example in the preferred embodiment communication system shown in FIG. 2, is simply the squared, summed, and scaled outputs of Walsh code transformers 232 and 234. The outputs of the Walsh code transformers 232 and 234 can be used directly because each group of sampled signals 228 and 229 corresponds to a single transmitted orthogonal code which represents the same set of input data bits encoded into a group of data symbols which were interleaved as a group and mapped as a group to the transmitted orthogonal code.

In contrast, the communication system shown in FIG. 1 generates soft decision transition metrics from a group of individual deinterleaved soft decision data 164. Each individual soft decision data 164 was computed from the product of a particular selected summed output of Walsh code transformers 132 and 134 and a bit from the index data symbol associated with the particular output of the Walsh code transformers. This use of individual deinterleaved soft decision data 164 to form the soft decision transition metrics is necessary because each group of sampled signals 128 and 129 corresponds to a single transmitted orthogonal code which does not represent the same set of input data bits. In the encoder 100 shown in FIG. 1, the encoded data bits or data symbols are individually interleaved rather than interleaved as a group. Therefore, a group interleaved data symbols representing more than one set of input data bits is mapped to the transmitted orthogonal code.

Thus, the optimal soft decision transition metrics used in MLSE decoding, as shown in FIG. 2, differ from the metrics generated in the communication system shown in FIG. 1. In addition, the preferred embodiment communication system shown in FIG. 2 provides significant improvements over the communication system shown in FIG. 1. One improvement is that when the optimal soft decision metrics are used in a communication system, having a fixed maximum average bit error rate, rather than the soft decision metrics described in reference to FIG. 1, the signal to noise ratio (i.e., $E_b/N_0$) can be significantly less in the communication system using the optimal soft decision transition metrics. As a result, the communication system using the optimal soft decision metrics can tolerate more noise in a communication channel. In a spread spectrum CDMA communication system the amount of noise is directly related to the number of simultaneous code divided channels (i.e., users) operating in the same spectral band or range. Therefore, the communication system using the optimal soft decision metrics can tolerate more users than the communication system described in FIG. 1. Experimental results for the non-coherent communication system environment described above indicate that the improvement in signal to noise ratio from using the optimal soft decision metrics is approximately 1 to 2 dB over the soft decision metrics as described in the communication system shown in FIG. 1. In other words, the coding gain derived from the use of the optimal soft decision metrics is greater than the coding gain derived from using the soft decision metrics as described in the communication system shown in FIG. 1. Another improvement is the simplified structure for the decoding portion of the communication system.

In implementing the use of these optimal soft decision transition metrics, the interleaving of the data symbols (i.e., encoded data bits) is affected. Interleaving of related data symbols causes bursts of errors in the communication channel to be spread out in time and thus to be handled by the decoder as if they were independent random errors. Since, channel memory decreases with time separation, the idea behind interleaving is to separate (i.e., make independent) the related data symbols of an encoded data bit in time. The intervening space in a transmission block is filled with other data symbols related to other encoded bits. Separating the data symbols in time effectively transforms a channel with memory into a memoryless one, and thereby enables the use of the random-error correcting codes (e.g., convolutional codes and block codes). A MLSE convolutional decoder makes a decision based on a sequence of data samples instead of a single data sample. Thus, in order to obtain the best result in interleaving, the data samples on which the decoding decision is based should be as independent as possible. However, when transmitted data symbols are organized into blocks, the maximum separation between any two data symbols cannot be larger than the block size. As a result, data samples of a received signal including the transmitted data symbols may not be independent of each other when fading of the signal is slow.

For a convolutional decoder with a constraint length of K, all of the interleaving units within the constraint length K will affect a decoding decision provided that only the first error event occurs. However, in a practical environment, especially under low signal to noise ratios, the interleaving units slightly beyond the constraint length will also affect a decoding decision, because the error event may have a longer length. An optimal interleaver is designed according to the following criteria. First, I (i.e., the minimum separation or distance between non-interleaved consecutively input interleaved units) is chosen such that $I=B/J$. B is the transmission block length or size of the interleaver matrix in units of the size of the interleaved units (e.g. the size of each group of data symbols or in the case of interleaving orthogonal codes, the size of each orthogonal code). J is chosen to be an integer that is larger than K and less than 1.5K. It will be appreciated by those skilled in the art that numerous interleaving distances I can be chosen in accordance with the principles set forth above for a given set of operating environments parameters J, K and B without departing from the scope and spirit of the present invention.

For the preferred embodiment communication system shown in FIG. 2, the constraint length is chosen to be nine data bits input to encoder 204. In particular, two input bits are convolutionally encoded into six data symbols with a constraint length of nine input data bits (i.e., 2/6 encoding with $K=9$). Each set of six data symbols related to the same two input data bits are grouped together as an interleaving unit. K in terms of interleaving units can be found by dividing the constraint length of nine input data bits by two input data bits which generate a group of six data symbols or one interleaving unit. Thus, 4.5 interleaving units or groups of data symbols will affect a single decoding decision (i.e., $K=4.5$). In addition, the block interleaver 208 will hold 576 data symbols which corresponds to the number of data symbols which can be transmitted in a single transmission block by the transmitting portion 216. Thus, the interleaver 208 interleaves 96 interleaving units in each block interleave or $B=96$. J was chosen to be 6 which is greater than K of 4.5 and less than 1.5K of 6.75. Therefore, I is chosen to be equal to B/J which is 96 divided by 6 (i.e., $I=16$). As a result, interleaver 208 will interleave any two adjacent non-interleaved input groups of data symbols such that the two groups are separated by 5 other groups of data symbols at the output of the interleaver 208.

In contrast in the communication system shown in FIG. 1, the constraint length is chosen to be nine data bits input to encoder 104 which encodes one input bit into three data symbols (i.e., ⅓ encoding with $K=9$). An interleaving unit equals one input data symbol. Thus K in terms of interleaving units is 27 data symbols or $K=27$ (i.e., three data symbols per input data bit times a constraint length of nine input data bits). In addition, the block interleaver 108 will hold 576 data symbols or interleaving units (i.e., $B=576$) which corresponds to the number of data symbols which can be transmitted in a single transmission block by the transmitting portion 116. J was chosen to be 32 which is greater than K of 27 and less than 1.5K of 40.5. Therefore, I is chosen to be equal to B/J which is 576 divided by 32 (i.e., $I=18$). As a result, interleaver 108 will interleave any two adjacent non-interleaved input data symbols such that the two data symbols are separated by 31 other data symbols at the output of the interleaver 108.

The different interleaving of the communication systems shown in FIG. 1 and 2 result in different levels of performance of the encoding and decoding portions of the communication system. The performance difference is particularly distinctly seen in the signal non-fading environments of an additive white Gaussian noise (AWGN) communication channel. Several factors affect performance of encoding and decoding in a fading environment including: AWGN coding gain and diversity. As previously mentioned, the coding gain of the communication system shown in FIG. 2 using a communication channel such as an AWGN channel is greater than the coding gain of the communication system shown in FIG. 1. The diversity inherent in convolutional coding is equal to the number of data samples affecting a decoding decision. For a first error event, the diversity is equal to the constraint length. For the communication system shown in FIG. 2, the diversity is equal to about 5, because approximately 5 received orthogonal code words affect a single decoding decision. In contrast, for the communication system shown in FIG. 1, the diversity is 27. The diversity is much greater because all 27 data samples which affect a decoding decision are taken from different portions of the received signal stream. This greater diversity in the communication system shown in FIG. 1 makes it perform better in ideal Rayleigh/Nakagami fading or infinite interleaving environments having a high signal to noise ratio than the communication system shown in FIG. 2. However, when the signal to noise ratio is lowered (e.g., during deep fading), the performance of the communication system shown in FIG. 2 improves with respect to the communication system shown in FIG. 1 because the AWGN coding gain becomes more important. In slow fading environments like Jakes model environments, entire transmission blocks can be in fade (i.e., low signal to noise ratios exist) interleaving and diversity characteristics do not improve decoding decisions much. However, AWGN coding gain is very important and as a result the communication system shown in FIG. 2 will perform better than the communication system shown in FIG. 1. Thus, the difference in the interleaving of the data symbols in the communication systems shown in FIGS. 1 and 2 affect the performance of the communications in signal fading environments. However, the greater in the AWGN coding gain of the communication system shown in FIG. 2 overcomes the greater diversity of the communication system shown in FIG. 1 in most slow signal fading situations.

In summary, the coding gain derived from the use of the optimal soft decision metrics is greater than the coding gain derived from using the soft decision metrics as described in the communication system shown in FIG. 1. For example, in the non-coherent communication system environment improvement in signal to noise ratio from using the optimal soft decision metrics used by the communication system shown in FIG. 2 is approximately 1 to 2 dB over the soft decision metrics as described in the communication system shown in FIG. 1. Further, this greater coding gain of the communication system shown in FIG. 2 overcomes the greater diversity of the communication system shown in FIG. 1 in most signal fading situations.

A description of a preferred embodiment communication system, shown in FIG. 2, which incorporates the above mentioned optimizing principles for a MLSE decoding in a system using orthogonal codes follows. In the encoding portion 200 of the communication system, traffic channel data bits 202 are input to an encoder 204 at a particular bit rate. The input traffic channel data bits can include either voice converted to data by a vocoder, pure data, or a combination of the two types of data. Encoder 204 encodes the input data bits 202 into data symbols at a fixed encoding rate with an encoding algorithm which facilitates subsequent maximum likelihood decoding of the data symbols into data bits (e.g. convolutional or block coding algorithms). The data symbols associated with each input data bit 202 are grouped together. Each group may include the data symbols associated with more than one input data bit 202. These groups of data symbols 206 are output by the encoder 204.

A detailed example of a particular communication system with reference to the system elements of the preferred embodiment system shown in FIG. 2 will be described below. The particular portion of the detailed example concerning each element will immediately follow the description concerning that particular element shown in FIG. 2. Turning now to the particular portion of the detailed example concerning the encoder 204, encoder 204 preferably receives input data bits 202 at a rate of 9.6 kbits/second. The encoder 204 convolutionally encodes the input data bits 202 at a fixed encoding rate of two data bits to six data symbols (i.e., 2/6 encoding) and with a constraint length of nine (K=9). The set of six data symbols associated with each two input data bits 202 are grouped together. These groups of six data symbols 206 are output by encoder at a 28.8 ksymbols/second rate. The groups of six data symbols 206 are generated using encoding generators $g(x)$. The polynomial based generators as described in octal form preferably are $g_1(x)=[557]$, $g_2(x)=[663]$, $g_3(x)=[711]$, $g_4(x)=[1336]$, $g_5(x)=[1546]$, and $g_6(x)=[1622]$, respectively. It will be appreciated by those skilled in the art that the output of a rate ⅓ convolutional encoder having generators $g_1(x)$, $g_2(x)$, and $g_3(x)$ with K=9 which receives two consecutive input data bits and is operated twice can be shown to be equivalent to the output of a single 2/6 rate generators $g_1(x)$, $g_2(x)$, $g_3(x)$, $g_4(x)$, $g_5(x)$, and $g_6(x)$ with K=9 when the same bits are input to the rate ⅓ encoder and the rate 2/6 encoder. Further, it will be appreciated that other sets of six generators can be used to encode the input data bits without departing from the scope of the present invention.

In an alternative preferred embodiment, encoder 204, as noted above, preferably receives input data bits 202 at a rate of 9.6 kbits/second. The encoder 204 convolutionally encodes the input data bits 202 at a fixed encoding rate of two data bits to six data symbols (i.e., 2/6 encoding) and with a constraint length of nine (K=9). The set of six data symbols associated with each two input data bits 202 are grouped together. These groups of six data symbols 206 are output by encoder at a 28.8 ksymbols/second rate. However, in this alternative preferred embodiment, the encoding generators $g(x)$ used by encoder 204 to encode the groups of six data symbols 206 are optimized for use in subsequent orthogonal coding. In order to perform such an optimization of the encoding generators of encoder 204, the weight distribution or weight spectrum of the codewords generated by the encoding generators must be analyzed.

Figure 5:
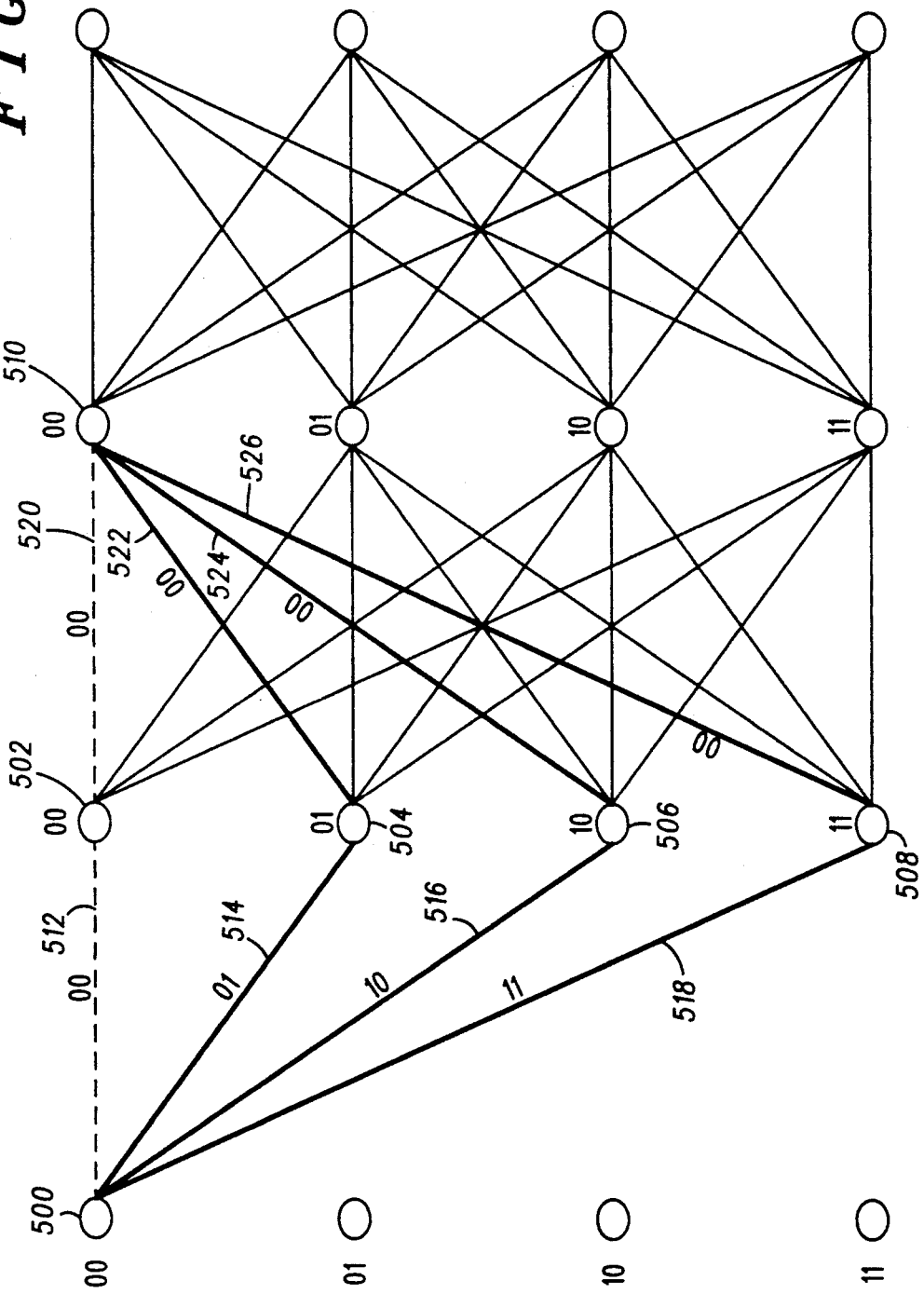
FIG. 5 is a diagram showing the trellis diagram of an example convolutional encoding generator for an encoder.

The encoder 204 can be conveniently described by a trellis diagram. In FIG. 5, a trellis diagram of a simple convolutional encoder is shown. It will be appreciated by those skilled in the art that, although a more sophisticated convolutional encoder 204 would be employed in the preferred alternative embodiment, the principles and techniques described in this example can be readily applied to the preferred alternative embodiment. In this trellis diagram, a codeword is associated with a path (e.g., path 512/520) between two states or nodes (e.g., nodes 500 and 510). These paths can be divided into two subsets consisting of correct and incorrect paths.

What constitutes a correct and an incorrect path can be more easily understood through the use of an example. In this example, the convolutional encoder is started in state 00 (i.e., at node 500). Further, the encoder 204 is assumed to have received two data bits 202 corresponding to 00. For the first time-state transition, the encoder 204 transitions to node 502 along a branch 512, because 00 was received.

Subsequently, for the second time-state transition, the encoder 204 is assumed to receive two more data bits 202 corresponding to 00. As a result, the encoder 204 transitions to node 510 from node 500 through node 502 along a path 512/520, because 0000 was received. This path 512/520 corresponds to a correct codeword 0000. A corresponding decoder (e.g., decoder 266) will evaluate the metrics of all the possible paths in the trellis. Therefore, other paths which represent incorrect codewords may be selected by the decoder. For example, these incorrect paths may correspond to transitions of the encoder 204 for which the encoder 204 may transition along three other paths to node 510. The decoder may have assumed that the encoder 204 transitioned to node 510 from node 500 through node 504 along a first incorrect path 514/522, because 0100 was received. Similarly, the decoder may have assumed that the encoder 204 transitioned to node 510 from node 500 through node 506 along a second incorrect path 516/524, because 1000 was received. Finally, the decoder may have assumed that the encoder 204 transitioned to node 510 from node 500 through node 508 along a third incorrect path 518/526, because 1100 was received.

Weight (k) is a parameter of a path which is defined to be the number of the groups of data symbols generated by the generators of the encoder from the received data bits associated with branches in an incorrect path that are different from the groups of data symbols associated with branches of the correct path. In this example, for a path from node 500 to 510, the correct path 512/520 and this path has a k=0. In contrast, each of the incorrect paths 514/522, 516/524, and 518/526 has a weight up to k=2, because each of the incorrect paths does not share any branch (i.e., branches 514, 516, 518, 522, 524 or 526) of their path with the branches of the correct path 512/520 (i.e., branches 512 or 520). By proper selection of the generators, it is possible that these three paths all have a weight k=2. The minimum distance (d(min)) between a correct path and an incorrect path which start and end at the same modes is equal to the constraint length (K) divided by the number of received data bits used to generate a single group of data symbols rounded to the next highest whole number. For example, if K=9 and two received data bits are used, then d(min)=round(9/2)=5. The minimum distance is the minimum number of branches which differ between the correct path and incorrect path which start and end at the same nodes. Further, the minimum weight (k) can not be larger than the minimum distance (d(min)) for the encoder.

The weight spectrum for a convolutional generator can be described by the following pair of functions:

$$\sum_{k=d(\min)}^{\infty} a_k W^k \text{ and } \sum_{k=d(\min)}^{\infty} b_k W^k \quad \text{(eq. 8)}$$

where W is a function of the type of encoder used, $a_k$ is the number of finite length incorrect codewords or incorrect paths with a weight k, and $b_k$ is the total number of input data bits in all incorrect paths of weight k which were differ from the correct path input data bits. In the example encoder of FIG. 5 which has properly selected generators, for k=2 in this trellis diagram, then $a_k=3$ and $b_k=4$. As previously discussed, $a_k$ is calculated by noting that each of the incorrect paths 514/522, 516/524, and 518/526 does not share any branch (i.e., branches 514, 516, 518, 522, 524 or 526) of their path with the branches of the correct path 512/520 (i.e., branches 512 or 520) and as such, by using proper generators, two branches (and their corresponding group of data symbols) of an incorrect path will differ from the correct path (i.e., these paths all have a weight k=2). In addition, $b_k$ is calculated by noting that for each of the incorrect paths 514/522, 516/524, and 518/526 the decoder may have determined that 0100, 1000, and 1100 was received, respectively. Further, for the correct path 512/520, the decoder would determine that 0000 was received. Therefore, $b_k$ is the sum of the differences between the correct and incorrect determinations of the decoder which is equal to four (i.e., 1+1+2=4). Both $a_k$ and $b_k$ are also known as error coefficients of the codewords generated by the convolutional encoder. The $a_k$ error coefficient is related to the block error probability of the codewords generated and the $b_k$ error coefficient is related to the bit error probability of the codewords generated. Thus, the most desirable generators of a convolutional encoder is the ones which generate codewords having the smallest $a_k$ and/or $b_k$ for all values of k.

Turning now to this alternative preferred embodiment, the encoding generators g(x) used by encoder 204 to encode the groups of six data symbols 206 can be selected in accordance with the above-mentioned considerations. In this preferred embodiment encoder 204, a rate 2/6 convolutional encoder having a constraint length of nine data bits (K=9) is used. Therefore, the minimum distance d(min) is five (i.e., round(9/2)=5). Moreover, the convolutional encoder used has four transitions (i.e., path branches) which can branch from or merge into each state or node. Therefore, the minimum number of incorrect branches of a path or codewords with a weight of five is three (i.e., four path branches minus one correct path branch).

On further examination of the set of generators (i.e., the set of polynomial based generators as described in octal form which include $g_1(x)=[557]$, $g_2(x)=[663]$, $g_3(x)=[711]$, $g_4(x)=[1336]$, $g_5(x)=[1546]$, and $g_6(x)=[1622]$) described above which were not optimized with respect to the weight spectrum parameters $a_k$ and $b_k$ have a non-optimal set of $a_k$ and $b_k$ values. More precisely, when these generators are used for convolutional code generation in an orthogonal coding environment, the weight spectrum yielded is $a_k=3$, 12, 42, 184, 769 and $b_k=4$, 35, 165, 916, 4667, for k=5-9 for the codes generated. Better sets of convolutional code generators are available with respect to optimization of $a_k$ and $b_k$ in an orthogonal coding environment.

For example, three different sets of generators for a 2/6 convolutional encoder in an orthogonal coding environment yield the weight spectrum of $a_k=3$, 9, 42, 165, 705 and $b_k=4$, 24, 148, 776, 3984, for k=5-9 for the generated codes. These three sets of generators as described in octal form are:

| $g_1(x)$ | $g_2(x)$ | $g_3(x)$ | $g_4(x)$ | $g_5(x)$ | $g_6(x)$ |
|---|---|---|---|---|---|
| 555 | 434 | 141 | 1332 | 1070 | 302 |
| 575 | 414 | 020 | 1372 | 1030 | 040 |
| 434 | 161 | 141 | 1070 | 342 | 302 |

Moreover, other sets of six generators can be developed from the group of generators g(x)=(575, 555, 434, 414, 161, 141, 020, 1372, 1332, 1070, 1030, 342, 302, and 040) which also have the same weight spectrum as those described in the above table. Therefore, in this alternative preferred embodiment, the encoding generators g(x) preferably used by encoder 204 to encode the input data bits 202 into groups of six data symbols 206 is selected from a set of six generators developed from the group of generators g(x) consisting of (575, 555, 434, 414, 161, 141, 020, 1372, 1332, 1070, 1030, 342, 302, and 040) such that the weight spectrum parameters $a_k$ and $b_k$ are reduced or minimized. It will be appreciated by those skilled in the art that the output of a rate ⅓ convolutional encoder having generators $g_1(x)$, $g_2(x)$, and $g_3(x)$ with K=9 which receives two consecutive input data bits and is operated twice can be shown to be equivalent to the output of a single 2/6 rate generators $g_1(x)$, $g_2(x)$, $g_3(x)$, $g_4(x)$, $g_5(x)$, and $g_6(x)$ with $K=9$ when the same bits are input to the rate $\frac{1}{3}$ encoder and the rate 2/6 encoder. Further, it will be appreciated that other sets of six generators can be used to encode the input data bits while minimizing the weight spectrum parameters $a_k$ and $b_k$ without departing from the scope of the present invention. By using these generators with improved weight spectrum in the preferred alternative embodiment encoder 204, an encoder 204 can be provided which has an operational improvement of 0.1 dB to 0.2 dB over the preferred embodiment encoder 204 which was not optimized with respect to it's weight spectrum.

The groups of data symbols 206, as generated by either the preferred embodiment or the alternative preferred embodiment encoder 204, are then input into an interleaver 208. It will be appreciated by those skilled in the art that the interleaver 208 could perform the grouping of data symbols operation rather than the encoder 204. Interleaver 208 block interleaves the input groups of data symbols 206 by group. In the interleaver 208, each group of data symbols is individually input into a matrix which defines a predetermined size block of data symbols. The groups of data symbols are input into locations within the matrix so that the matrix is filled in a column by column manner. The groups of data symbols are individually output from locations within the matrix so that the matrix is emptied in a row by row manner. Typically, the matrix is a square matrix having a number of rows equal to the number of columns; however, other matrix forms can be chosen to increase the output interleaving distance between the consecutively input non-interleaved groups of data symbols. The predetermined size of the block of data symbols defined by the matrix is derived from the maximum number of data symbols, representing input data bits, which can be transmitted at a predetermined chip rate within a predetermined length transmission block. The interleaved groups of data symbols 210 are output by the interleaver 208 at the same data symbol rate that they were input.

Figures 3, 4:
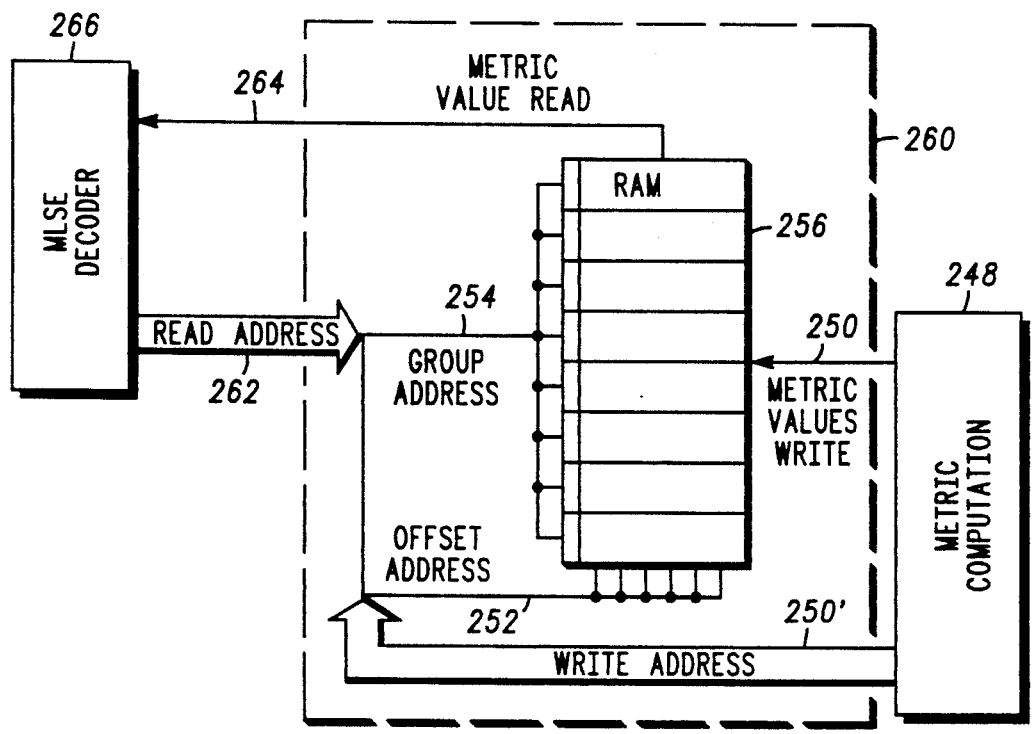
FIG. 3 is a block diagram showing a preferred embodiment decoding apparatus which uses a memory based lookup table.
FIG. 4 is block diagram showing a preferred embodiment matrix representation of an interleaver loaded with encoded data bits.

Turning now to the particular portion of the detailed example concerning the interleaver 208, interleaver 208 preferably receives groups of data symbols 206 at a rate of 28.8 ksymbols/second. Interleaver 208 block interleaves the input groups of six data symbols 206 by group. In the interleaver 208, each group of six data symbols is individually input into a matrix which defines a predetermined size block of 576 data symbols. Shown in FIG. 4 is block diagram of a preferred embodiment 16 by 6 matrix of interleaver 208 loaded with groups of data symbols 206. Each group of data symbols is located within a single box of the matrix (e.g. box 400). Each group consists of the six data symbols convolutionally encoded from two input data bits 202 which are represented by two numbers in parentheses (e.g. (1) and (2)). The numbers in parentheses indicate the order in which the data bits 202 were originally encoded into data symbols. Each group of data symbols are input into locations (i.e., boxes) within the matrix so that the matrix is filled in a column by column manner. For example, a first column of boxes in the matrix is filled with the first sixteen groups of data symbols 206 input into the interleaver 208. The first column includes a first group consisting of (1) and (2) which is input into box 400 of the matrix and a second group consisting of (3) and (4) which is input into box 402 of the matrix. The second column of boxes is filled with the next sixteen groups of data symbols 206. The second column includes a seventeenth group consisting of (33) and (34) which is input into box 404 of the matrix. The other four columns are filled in a similar manner. The groups of six data symbols are individually output from locations (i.e., boxes) within the matrix so that the matrix is emptied in a row by row manner. For example, the first row including box 400 and box 404 are output prior to the second row including box 402. The other rows of the matrix are output in a similar manner. The stream of output groups of data symbols 210 is interleaved such that, for example, the first group consisting of (1) and (2) is now separated by five other groups from the second group consisting of (3) and (4). The interleaved groups of data symbols 210 are output by the interleaver 208 at the same data symbol rate of 28.8 ksymbols/second that they were input to the interleaver 208. The predetermined size of the block of data symbols defined by the matrix is derived from the maximum number of data symbols, representing input data bits, which can be transmitted at a predetermined chip rate within a predetermined length transmission block. In the preferred embodiment shown in FIG. 2 data symbols 206 are output from the encoder 202 at a 28.8 ksymbols/second rate. As a result the maximum predetermined chip rate for transmitting those data symbols 206 is 28.8 ksymbols/second. Further, the predetermined length of the transmission block is 20 milliseconds. Therefore, the predetermined size of the block of data symbols is 28.8 ksymbols/second times 20 milliseconds which equals 576 data symbols. Although the preferred embodiment interleaver 208 has been described in particular detail, it will be appreciated by those skilled in the art that numerous variations of the interleaver could be implemented without departing from the scope of the present invention. For example, the size of the interleaving block could be altered to accommodate different transmission lengths or rates. Also, the dimensions of the matrix could be altered to increase or decrease the interleaved distance between consecutively input groups of data symbols.

The interleaved groups of data symbols 210 are then input to a mapper 212. The mapper 212 derives a sequence of fixed length orthogonal codes 214 from the interleaved groups of data symbols 210. Each interleaved group of data symbols 210 selects one orthogonal code from a group of mutually orthogonal codes to represent the group of data symbols 210. The mapper 212 outputs a sequence of orthogonal codes 214 which correspond to the input data symbols 210 from encoding portion 200 of the communication system at a fixed data symbol rate related to the input data symbol rate.

Turning now to the particular portion of the detailed example concerning the mapper 212, mapper 212 preferably receives interleaved groups of six data symbols at a rate of 28.8 ksymbols/second. The mapper 212 preferably derives a 64 bit length Walsh code from each input group of six data symbols 210. The six data symbols of each group are used as a binary index to select one of 64 mutually orthogonal Walsh codes. The 64 mutually orthogonal Walsh codes preferably correspond to single rows or columns of a 64 by 64 Hadamard matrix. The mapper 212 outputs a sequence of Walsh codes 214 which correspond to the input groups of data symbols 210 at a fixed data symbol rate of 307.2 ksymbols/second. The increase in the data symbols rate is due to the mapping function of the mapper 212 in which a 64 bit length orthogonal code replaces each input group of six data symbols (i.e., 64 bit length orthogonal code (64 data symbols) divided by six data symbols times the 28.8 ksymbols/second input rate of the data symbols equals 307.2 ksymbols/second). It will be appreciated by those skilled in the art that other types and lengths of orthogonal codes could be used without departing from the scope of the present invention.

In an alternative embodiment of the present invention which is roughly equivalent to the preferred embodiment described above, the order of input of the groups of data symbols 206 to the group level block interleaver 208 and mapper 212 is reversed. The groups of data symbols 206 are input to a mapper 212. The mapper 212 derives a sequence of fixed length orthogonal codes 214 from the groups of data symbols 206. Each group of data symbols 206 selects one orthogonal code from a group of mutually orthogonal codes to represent the group of data symbols 206. The mapper 212 outputs a sequence of orthogonal codes which correspond to the input data symbols 206 at a fixed data symbol rate related to the input data symbol rate. Subsequently, the sequence of orthogonal codes are input into an interleaver 208. Interleaver 208 block interleaves the input sequence of orthogonal codes by orthogonal code. In the interleaver 208, each orthogonal code is individually input into a matrix which defines a predetermined size block of orthogonal codes. The orthogonal codes are input into locations within the matrix so that the matrix is filled in a column by column manner similar to the groups of data symbols described above. Then, the orthogonal codes are individually output from locations within the matrix so that the matrix is emptied in a row by row manner similar to the groups of data symbols described above. The interleaved orthogonal codes 214 are output from encoding portion 200 of the communication system by the interleaver 208 at the same data symbol rate that they were input to the interleaver 208.

An example of such an alternative arrangement of mapper 212 and interleaver 208 which could replace the preferred embodiment detailed example interleaver 208 and mapper 212 combination follows. The groups of six data symbols 206 are preferably input to a mapper 212 at a rate of 28.8 ksymbols/second. The mapper 212 derives a 64 bit length Walsh code from each input group of six data symbols 206. The six data symbols of each group are used as a binary index to select one of 64 mutually orthogonal Walsh codes. Due to the mapping function of the mapper 212 in which a 64 bit length orthogonal code replaces each input group of six data symbol, the mapper 212 outputs a sequence of Walsh codes at a fixed data symbol rate of 307.2 ksymbols/second. Subsequently, the sequence of Walsh codes are input into an interleaver 208 at a rate of 307.2 ksymbols/second. Interleaver 208 block interleaves the input sequence of Walsh codes by Walsh code. In the interleaver 208, each Walsh code is individually input into a 16 by 6 matrix which defines a predetermined size block of 6144 data symbols (i.e., 96 Walsh codes). The Walsh codes are input into locations within the matrix so that the matrix is filled in a column by column manner similar to the groups of data symbols described above in reference to FIG. 4. Then, the Walsh codes are individually output from locations within the matrix so that the matrix is emptied in a row by row manner similar to the groups of data symbols described above in reference to FIG. 4. The interleaved Walsh codes 214 are output from encoding portion 200 of the communication system by the interleaver 208 at the same data symbol rate of 307.2 ksymbols/second that they were input to the interleaver 208.

The sequence of orthogonal codes 214 is input to a transmitting portion 216 of the communication system. The sequence 214 is prepared for transmission over a communication channel by a modulator 217. Subsequently, the modulated sequence is provided to an antenna 218 for transmission over the communication channel 220.

Turning now to the particular portion of the detailed example concerning the modulator 217, modulator 217 preferably receives the sequence 214 at a data symbol rate of 307.2 ksymbols/second and prepares the sequence 214 for direct sequence code divided spread spectrum transmission by spreading the sequence 214 with a long PN spreading code. It will be appreciated by those skilled in the art that other types of spreading codes could be used to spread sequence 214. The PN spreading code is a user specific sequence of symbols or unique user code which is mixes with the sequence 214 at a fixed chip rate of 1.228 Mchips/second. As a result of this mixing function, the sequence 214 is spread with the PN spreading code such that 256 bit length sequences are formed which represent each 64 bit length Walsh code. In addition to providing an identification as to which user sent the encoded traffic channel data bits 202 (i.e., the Walsh code sequence 214) over the communication channel 220, the unique user PN code enhances the security of the communication in the communication channel by scrambling the encoded traffic channel data bits 202. In addition, the user code spread encoded data bits are spread by a pair of short PN spreading codes (i.e., short when compared to the long PN spreading code) to generate an I-channel and Q-channel code spread sequence. The I-channel and Q-channel code spread sequences are used to bi-phase modulate a quadrature pair of sinusoids by driving the power level controls of a the pair of sinusoids. The sinusoids output signals are summed, bandpass filtered, translated to an RF frequency, amplified, filtered and radiated by an antenna 218 to complete transmission of the traffic channel data bits 202 in a communication channel 220 as a spread spectrum signal. As a result of the encoding and modulating operations, each pair of input data bits 202 are represented by 256 bit length sequences which are transmitted in communication channel 220.

A receiving portion 222 of the communication system receives the transmitted spread spectrum signal from over the communication channel 220 through antenna 224. The received signal is sampled into data samples by demodulator 226. Subsequently, the data samples 228 and 229 are output to the decoding portion 230 of the communication system.

Turning now to the particular portion of the detailed example concerning the demodulator 226, the demodulator 226 preferably samples the received spread spectrum signal by filtering, demodulating, translating from the RF frequencies, and sampling at a predetermined rate of 1.2288 Msamples/second. Subsequently, the in-phase sampled signal and quadrature sampled signal are independently despread by correlating the received sampled signals with the short PN spreading codes and the long PN spreading code. The resulting despread in-phase 228 and quadrature 229 sampled signals are sampled a predetermined rate of 307.2 ksamples/second so that a sequence of four samples of the received spread spectrum signal is despread and/or represented by a single data sample.

The sampled signals 228 and 229 are independently input to a decoding portion 230 of the communication system which non-coherently detects/decodes the sampled signals 228 and 229 into estimated data bits 268. In order to decode the sampled signals 228 and 229, predetermined length groups of sampled signals are independently input to orthogonal code transformers 232 and 234, respectively. The orthogonal code transformers 232 and 234 output a plurality of transformer output signals 233 and 235, respectively. Each transformer output signal corresponds to a measure of confidence that a particular group of sampled signals corresponds to a particular orthogonal code from within a set of mutually orthogonal codes. In addition, each transformer output signal has an associated index data symbol which indicates which particular orthogonal code from within the set of mutually orthogonal codes that the transformer output signal corresponds to. The index data symbol also corresponds to a possible transition within a maximum likelihood decoding trellis which decoder 266 will subsequently be determining. Subsequently, each transformer output signal within the groups of transformer output signals 233 and 235 is squared by transformer output signal squaring mechanisms 236 and 238, respectively. Subsequently, a group of decision values 242 is generated by adding mechanism 240 which adds together each pair of squared transformer output signals (i.e. one from each of the transformer output signal squaring mechanisms 236 and 238) having associated index data symbols which indicate that the transformer output signals correspond to the same orthogonal code.

Turning now to the particular portion of the detailed example concerning the transformers 232 and 234, the squaring mechanisms 236 and 238, and the adding mechanism 240, the in-phase 228 and quadrature 229 sampled signals are independently input to a decoding portion 230 of the communication system which non-coherently detect/decode the sampled signals 228 and 229 into estimated data bits 268. In order to decode the sampled signals 228 and 229, 64 sample length groups of sampled signals are independently input at a rate of 307.2 ksamples/second to fast Hadamard transformers 232 and 234, respectively. Each fast Hadamard transformers 232 and 234 output 64 transformer output signals 233 and 235, respectively. Each transformer output signal corresponds to a measure of confidence that a particular group of 64 sampled signals corresponds to a particular 64 bit length Walsh code from within a set of 64 mutually orthogonal Walsh codes. In addition, each transformer output signal has an associated 6 bit length index data symbol which indicates which particular Walsh code from within the set of 64 mutually orthogonal Walsh codes that the transformer output signal corresponds to. Subsequently, each transformer output signal within each group of 64 transformer output signals 233 and 235 is squared by transformer output signal squaring mechanisms 236 and 238, respectively. Subsequently, a group of 64 decision data 242 is generated and output at a rate of 307.2 kdata/second for each pair of groups of squared transformer output signals by adding mechanism 240 which adds together each pair of squared transformer output signals (i.e. one from each of the transformer output signal squaring mechanisms 236 and 238) having associated index data symbols which indicate that the transformer output signals correspond to the same Walsh code.

The several groups of decision data 242 are then input into a deinterleaver 244 which block deinterleaves the input decision data 242 by group. In the deinterleaver 244, each group of decision data is individually input into a matrix which defines a predetermined size block of decision data. Each group of decision data is input into locations within the matrix so that the matrix is filled in a row by row manner. The groups of decision data 246 are individually output from locations within the matrix so that the matrix is emptied in a column by column manner. Typically, the matrix is a square matrix having a number of rows equal to the number of columns; however, other matrix forms can be chosen to match the form of the matrix used by interleaver 208. The predetermined size of the block of decision data defined by the matrix is derived from the number of decision data generated for each group of data samples, the number of data samples in each group of data samples and the maximum number of data samples, representing transmitted data symbols, which can be sampled at a predetermined chip rate from a received predetermined length transmission block. The deinterleaved groups of decision data 246 are output by the deinterleaver 244 at the same rate that they were input.

Turning now to the particular portion of the detailed example concerning the deinterleaver 244, deinterleaver 244 preferably receives several groups of 64 decision data 242 at a rate of 307.2 kdata/second. Deinterleaver 244 block deinterleaves the input groups of 64 decision data 242 by group. In the deinterleaver 244, each group of 64 decision data is individually input into a matrix which defines a predetermined size block of 6144 decision data. A 16 by 6 matrix of deinterleaver 244 is substantially similarly loaded and unloaded in an inverse manner to the manner in which the preferred embodiment 16 by 6 matrix of interleaver 208 was loaded and unloaded with groups of data symbols 206 as shown in FIG. 4. Each group of decision data is loaded into a single box of the matrix (e.g. box 400). Each group of decision data is input into locations (i.e., boxes) within the matrix so that the matrix is filled in a row by row manner. For example, a first row of boxes in the matrix is filled with the first six groups of decision data 242 input into the deinterleaver 244. The first row includes a first group of 64 decision data which is input into box 400 of the matrix and a second group of 64 decision data which is input into box 404 of the matrix. The second column of boxes is filled with the next six groups of decision data 242. The second column includes a seventh group of 64 decision data which is input into box 402 of the matrix. The other fourteen rows are filled in a similar manner. The groups of 64 decision data are individually output from locations (i.e., boxes) within the matrix so that the matrix is emptied in a column by column manner. For example, the first column including box 400 and box 402 are output prior to the second column including box 404. The other column of the matrix are output in a similar manner. The stream of output groups of data symbols 246 is deinterleaved such that, for example, the first group of 64 decision data now immediately precedes the seventh group in the output stream 246 of groups of decision data. Further the second group input to the deinterleaver is separated by fifteen other groups from the first group in the output stream 246 of data symbols. The deinterleaved groups of decision data 246 are output by the deinterleaver 244 at the same rate of 307.2 kdata/second that they were input to the interleaver 244. The predetermined size of the block of decision data defined by the matrix is derived from the number of decision data generated for each group of data samples, the number of data samples in each group of data samples and the maximum number of data samples, representing transmitted data symbols, which can be sampled at a predetermined chip rate from a received predetermined length transmission block. In the preferred embodiment shown in FIG. 2, 64 decision data are generated for each group of 64 data samples. Further, the maximum number of data samples, representing transmitted data symbols, which can be sampled at a predetermined chip rate of 307.2 ksamples/second from a received predetermined length transmission block of 20 milliseconds is 307.2 ksamples/second times 20 milliseconds which equals 6144 data samples. Therefore, the predetermined size of the block of decision data is 64 decision data per 64 data samples times 6144 data samples which equals 6144 decision data.

In an alternative embodiment of the present invention which is roughly equivalent to the preferred embodiment described above, the order in which the groups of data samples 228 and 229 are converted to decision data and the deinterleaving is reversed. In order to decode the sampled signals 228 and 229, predetermined length groups of sampled signals are independently input to two separate deinterleavers similar to deinterleaver 244 described above. Several groups of data samples are input into each deinterleaver which block deinterleaves the input data samples by group. In the deinterleaver, each group of data samples is individually input into a matrix which defines a predetermined size block of data samples. Each group of data samples is input into locations within the matrix so that the matrix is filled in a row by row manner. The groups of data samples are individually output from locations within the matrix so that the matrix is emptied in a column by column manner. The deinterleaved groups of data samples are output by each deinterleaver at the same rate that they were input. The deinterleaved groups of data samples from each deinterleaver are independently input to orthogonal code transformers similar to 232 and 234, respectively. The orthogonal code transformers output a plurality of transformer output signals similar to 233 and 235, respectively. Each transformer output signal corresponds to a measure of confidence that a particular group of deinterleaved sampled signals corresponds to a particular orthogonal code from within a set of mutually orthogonal codes. In addition, each transformer output signal has an associated index data symbol which indicates which particular orthogonal code from within the set of mutually orthogonal codes that the transformer output signal corresponds to. Subsequently, each transformer output signal within the groups of transformer output signals is squared by transformer output signal squaring mechanisms similar to 236 and 238, respectively. Subsequently, a group of deinterleaved decision values similar to 246 is generated by adding mechanism similar to 240 which adds together each pair of squared transformer output signals (i.e. one from each of the transformer output signal squaring mechanisms) having associated index data symbols which indicate that the transformer output signals correspond to the same orthogonal code. The adding mechanism generates groups of deinterleaved decision data similar to those output by deinterleaver 244 of the preferred embodiment, because the data sample signals 228 and 229 where deinterleaved prior to being input to the orthogonal code transformers and as a result the orthogonal code transformers produced deinterleaved output signals from which deinterleaved decision data were formed.

An example of such an alternative position of the deinterleaver which could replace the preferred embodiment detailed example position of deinterleaver 244 follows. 64 bit length groups of sampled signals 228 and 229 are independently input to two separate deinterleaver similar to interleaver 244 described above at a rate of 307.2 kdata/second. Each deinterleaver block deinterleaves the input groups of 64 data samples by group. In the deinterleaver, each group of 64 data samples is individually input into a 16 by 6 matrix which defines a predetermined size block of 6144 data samples. Each deinterleaver is loaded and unloaded with groups of 64 data samples in a manner similar to the manner in which the preferred embodiment 16 by 6 matrix of interleaver 244 was loaded and unloaded with groups of decision data as shown in FIG. 4. Each group of 64 data samples is input into locations within the matrix so that the matrix is filled in a row by row manner. The groups of 64 data samples are individually output from locations within the matrix so that the matrix is emptied in a column by column manner. The deinterleaved groups of data samples are output by each deinterleaver at the same rate of 307.2 kdata/second that they were input. The deinterleaved groups of 64 data samples from each deinterleaver are independently input to fast Hadamard transformers similar to 232 and 234, respectively. The fast Hadamard code transformers output 64 transformer output signals similar to 233 and 235, respectively. Each transformer output signal corresponds to a measure of confidence that' a particular group of deinterleaved sampled signals corresponds to a particular Walsh code from within a set of mutually orthogonal Walsh codes. In addition, each transformer output signal has an associated six bit length index data symbol which indicates which particular Walsh code from within the set of mutually orthogonal Walsh codes that the transformer output signal corresponds to. Subsequently, each transformer output signal within the groups of 64 transformer output signals is squared by transformer output signal squaring mechanisms similar to 236 and 238, respectively. Subsequently, a group of 64 deinterleaved decision values similar to 246 is generated by adding mechanism similar to 240 which adds together each pair of squared transformer output signals (i.e. one from each of the transformer output signal squaring mechanisms) having associated six bit length index data symbols which indicate that the transformer output signals correspond to the same Walsh code.

The deinterleaved groups of decision data 246 are input to metric computation unit 248. The metric computation unit 248 converts the groups of decision data 246 into groups of soft decision decoding metrics 250. The conversion typically involves scaling the groups of decision data 246 so that decoder 266 is able to use the decision data as soft decision decoding metrics. This scaling operation may include equalization of decision data 246 according to received signal strength information or transmitted power information related to the received spread spectrum signal. It will be appreciated by those skilled in the art that the decoder 266 could also be designed to include such compensation functions. The metric computation unit 248 also serves as an addressing mechanism for generating addresses in which to put the groups of soft decision decoding metrics in the metric lookup table 260. The index data symbols associated with each soft decision metric (i.e., scaled decision data) are used as part of the lookup table address generated by the metric computation unit 248. The groups of soft decision metrics 250 are output by the metric computation unit 248 at the same rate that the decision data 246 were input. However, it will be appreciated by those skilled in the art that metric computation unit 248 may also serve as a buffer mechanism for metric lookup table 260. In particular, metric computation unit 248 may temporarily store the soft decision metrics 250 and output the soft decision metrics 250 to lookup table 260 as needed.

Turning now to the particular portion of the detailed example concerning the metric computation unit 248, metric computation unit 248 preferably receives deinterleaved groups of 64 decision data 246 at a rate of 307.2 kdata/second. The metric computation unit 248 converts the groups of 64 decision data 246 into groups of 64 soft decision decoding metrics 250. In addition, the metric computation unit 248 generates addresses 250' in which to put the groups of 64 soft decision decoding metrics in the metric lookup table 260. The six bit length index data symbols associated with each soft decision metric are used as part of the lookup table address 250' generated by the metric computation unit 248. The groups of soft decision metrics 250 are output by the metric computation unit 248 at the same rate of 307.2 kmetrics/second that the decision data 246 were input.

The groups of soft decision metrics 250 are input to a metric lookup table 260. A preferred embodiment memory-based lookup table 260 is shown in FIG. 3. The lookup table 260 includes a memory portion 256 and address buses 252 and 254. Metric computation unit 248 provides a write address 250' for each associated soft decision metric 250 to metric lookup table 260. The write address consists of a group address portion which identifies a particular group of soft decision metrics from which each soft decision metric 250 is in and also an offset address portion which identifies the particular soft decision metric 250 of the particular group of soft decision metrics. The group address portion, which corresponds to data bits originally encoded by encoder 204, also corresponds to a particular time state in the maximum likelihood sequence estimation decoder 266. The offset address portion, which corresponds to the index data symbol associated with the particular soft decision metric, also corresponds to a possible transition within a maximum likelihood decoding trellis which decoder 266 will subsequently be determining. The offset address portion and group address portion of the write address 250' are placed on the data buses 252 and 254, respectively. Subsequently, each particular soft decision metric 250 associated with the particular write address 250' is stored within a location in the memory 256.

Turning now to the particular portion of the detailed example concerning the metric lookup table 260, metric lookup table 260 preferably receives the groups of soft decision metrics 250 at a rate of 307.2 kmetrics/second. However, as previously noted the lookup table may receive the soft decision metrics from a buffering mechanism of the metric computation unit 248 as needed. In the preferred embodiment memory-based lookup table 260 is shown in FIG. 3, the memory 256 consists of random access memory (RAM) 256 which is segmented into groups of 64. Metric computation unit 248 provides a write address 250' for each associated soft decision metric 250 to metric lookup table 260. The write address consists of a group address portion which identifies a particular group of 64 soft decision metrics to which each soft decision metric 250 belongs and also a six bit length offset address portion which identifies the particular soft decision metric 250 of the particular group of 64 soft decision metrics. The group address portion, which corresponds to two data bits originally encoded by 2/6 encoder 204, also correspond to a particular time state in the maximum likelihood sequence estimation decoder 266. The six bit length offset address portion, which corresponds to the six bit length index data symbol associated with the particular soft decision metric, also corresponds to a possible transition within a maximum likelihood decoding trellis which decoder 266 will subsequently be determining while generating estimated data bits 268. The six bit length offset address portion and group address portion of the write address 250' are placed on the data buses 252 and 254, respectively. Subsequently, each particular soft decision metric 250 associated with the particular write address 250' is stored within a location in the RAM-based lookup table 256.

Since, the soft decision metrics 250 have been stored in metric table 260, decoder 266 which uses maximum likelihood decoding techniques to generate estimated traffic channel data bits 268 can begin decoding operations. These maximum likelihood decoding techniques may be augmented by using an algorithm which is substantially similar to a Vitebi decoding algorithm. The decoder 266 uses groups of the soft decision metrics associated with possible transitions at each particular time state of the maximum likelihood sequence estimation decoder 266 to generate the estimated data bits 268. Decoder 266 provides a read address 262 to the lookup table 260 to retrieve particular soft decision metrics. The read address 262 includes an offset address portion which corresponds to a possible transition within the MLSE decoding algorithm and a group address portion which corresponds to a particular time state within the MLSE decoder 266. The offset address portion and group address portion of the read address 262 are placed on the address buses 252 and 254, respectively. Subsequently, each particular soft decision metric 264 associated with the particular read address 262 is retrieved from within a location in the memory 256. The estimated data bits 268 are generated at a rate related to the rate that the soft decision data 264 are retrieved into the decoder 266 and the number of estimated data bits 268 generated per group of soft decision metrics 264 retrieved.

Turning now to the particular portion of the detailed example concerning the decoder 266, decoder 266 preferably uses maximum likelihood decoding techniques to generate estimated traffic channel data bits 268. These maximum likelihood decoding techniques preferably are augmented by using an algorithm which is substantially similar to a Viterbi decoding algorithm. The decoder 266 preferably is a 2/6 convolutional decoder related to the encoded 204 originally used to encode traffic channel data bits 202. The decoder 266 uses groups of 64 soft decision metrics associated with 64 possible transitions at each particular time state of the maximum likelihood sequence estimation decoder 266 to generate two estimated data bits 268 per group of 64 soft decision metrics retrieved into decoder 266. Decoder 266 provides a read address 262 to the lookup table 260 to retrieve particular soft decision metrics. The read address 262 includes a six bit length offset address portion which corresponds to one of a possible 64 transitions within the MLSE decoding algorithm and a group address portion which corresponds to a particular time state within the MLSE decoder 266. The six bit length offset address portion and group address portion of the read address 262 are placed on the data buses 252 and 254, respectively. Subsequently, each particular soft decision metric 264 associated with the particular read address 262 is retrieved from within a location in the memory 256. The estimated data bits 268 are generated at a rate related to the rate that the soft decision data 264 are retrieved into the decoder 266 and the number of estimated data bits 268 generated per group of soft decision metrics 264 retrieved. If the soft decision data 264 are retrieved into the decoder 266 at a rate of 307.2 kmetrics/second and two estimated data bits are generated per 64 metrics input, then the estimated data bits are generated at a rate of 307.2 kmetrics/second time two bits per 64 metrics which is equal to 9600 estimated bits/second.

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed. For example, the modulator, antennas and demodulator portions of the preferred embodiment communication system as described were directed to CDMA spread spectrum signals transmitted over a radio communication channel. However, as will be understood by those skilled in the art, the encoding and decoding techniques described and claimed herein can also be adapted for use in other types of transmission systems like those based on TDMA and FDMA. In addition the communication channel could alternatively be an electronic data bus, wireline, optical fiber link, or any other type of communication channel.

What is claimed is:

1. An apparatus comprising a signal encoder, the signal encoder comprising:
   (a) encoding means for encoding input data bits of a signal into data symbols and grouping the data symbols, the data symbols being encoded with an encoding algorithm, wherein the encoding algorithm produces data symbols which are subsequently decoded into data signal bits using maximum likelihood decoding, the encoding algorithm comprising implementing at least one generator function having weight spectrum optimized for use in orthogonal coding; and
   (b) translating means, operatively coupled to the encoding means, for translating the groups of data symbols according to an algorithm selected from the group consisting essentially of (i) interleaving by group each group of data symbols within a predetermined size block and subsequently deriving an orthogonal code from each group of interleaved data symbols and (ii) deriving an orthogonal code from each group of data symbols and subsequently interleaving by orthogonal code each orthogonal code within a predetermined size block.

2. The apparatus of claim 1 wherein the encoding algorithm comprises a convolutional coding algorithm having at least one generator function selected from the group of generator functions as described in octal form consisting of: 575, 555, 434, 414, 161, 141, 020, 1372, 1332, 1070, 1030, 342, 302, and 040.

3. The apparatus of claim 2 wherein the encoding algorithm comprises a convolutional coding algorithm having a set of six generator functions selected from the group of sets of generator functions $g(x)$ as described in octal form consisting of:
   (a) $g1(x)=555$, $g2(x)=434$, $g3(x)=141$, $g4(x)=1332$, $g5(x)=1070$, and $g6(x)=302$;
   (b) $g1(x)=575$, $g2(x)=414$, $g3(x)=020$, $g4(x)=1372$, $g5(x)=1030$, and $g6(x)=040$; and
   (c) $g1(x)=434$, $g2(x)=161$, $g3(x)=141$, $g4(x)=1070$, $g5(x)=342$, and $g6(x)=302$.

4. The apparatus of claim 1 further comprising a signal transmitting means, operatively coupled to the signal encoder, for transmitting the translated groups of data symbols over a communication channel.

5. The apparatus of claim 4 wherein the signal transmitting means comprises means for preparing the translated groups of data symbols for transmission over the communication channel by spreading the translated groups of data symbols with a spreading code prior to transmission over the communication channel.

6. The apparatus of claim 4 wherein the communication channel is selected from the group consisting essentially of an electronic data bus, radio communication link, wireline and optical fiber link.

7. The apparatus of claim 4 further comprising:
   (a) signal receiving means for sampling a signal received from over the communication channel into data samples; and
   (b) a signal decoder, operatively coupled to the signal receiving means, the signal decoder comprising:
      (i) grouping means for grouping received data samples;
      (ii) transforming means, operatively coupled to the grouping means, for transforming the groups of data samples according to an algorithm selected from the group consisting essentially of (1) generating a plurality of soft decision similarity metrics and index data symbols for each group of data samples such that one index data symbol is associated with each soft decision metric and subsequently deinterleaving by group each group of soft decision metrics within a predetermined size block and (2) deinterleaving by group each group of data samples within a predetermined size block and subsequently generating a plurality of soft decision similarity metrics and index data symbols for each deinterleaved group of data samples such that one index data symbol is associated with each soft decision metric, each soft decision metric corresponding to a measure of confidence that a particular group of data samples is substantially similar to a particular orthogonal code from within a set of mutually orthogonal codes; and
      (iii) decoding means, operatively coupled to the transforming means, for generating at least one estimated data bit by utilizing maximum likelihood decoding techniques to derive the at least one estimated data bit from the soft decision metrics and associated index data symbols.

8. The apparatus of claim 7 wherein:

(a) the signal encoder encoding means comprises means for convolutionally encoding two input data bits of the signal into six data symbols and grouping the six data symbols derived from the two input data bits;

(b) the signal encoder translating means comprises means for translating the groups of data symbols according to an algorithm selected from the group consisting essentially of (i) interleaving as a group each group of six data symbols within the determined size block and subsequently deriving a 64 bit length orthogonal code from each group of six data symbols and (ii) deriving a 64 bit length orthogonal code from each group of six data symbols and subsequently interleaving as a group each 64 bit length orthogonal code within the predetermined size block;

(c) the signal transmitting means comprises means for spreading each 64 bit length orthogonal code with a predetermined spreading code such that 256 bit length sequences are formed which represent each 64 bit length orthogonal code and subsequently transmitting the 256 bit length sequences over the communication channel whereby each two input data bits are represented by a 256 bit length transmitted sequence;

(d) the signal receiving means comprises means for despreading the received signal with the predetermined spreading code to derive data samples such that each data sample represents a 4 bit length sequence of the received signal;

(e) the signal decoder grouping means comprises means for grouping the data samples into 64 bit length groups;

(f) the signal decoder transforming means comprises means for transforming the groups of data samples according to an algorithm selected from the groups consisting essentially of (i) generating 64 soft decision metrics and index data symbols for each 64 bit length group of data samples such that one index data symbol having at least a 6 bit length is associated with each soft decision metric and subsequently deinterleaving as a group each group of 64 soft decision metrics within the predetermined size block and (ii) deinterleaving as a group each 64 bit length group of data samples within the predetermined size block and subsequently generating 64 soft decision metrics and index data symbols for each deinterleaved 64 bit length group of data samples such that one index data symbol having at least a 6 bit length is associated with each soft decision metric, each soft decision metric corresponding to a measure of confidence that a particular group of data samples is substantially similar to a particular 64 bit length orthogonal code from within a set of 64 mutually orthogonal 64 bit length codes; and (g) the signal decoder decoding means comprises means for generating at least one estimated data bit by utilizing maximum likelihood decoding techniques including using the at least 6 bit length index data symbols and associated soft decision metrics.

9. The apparatus of claim 7 wherein the predetermined block size of the signal decoder transforming means is derived from the number of soft decision metrics generated for each group of data samples, the number of data samples in each group of data samples and the maximum number of data samples which can be sampled from a received signal transmission block.

10. The apparatus of claim 7 wherein the signal receiving means comprises means for despreading the received signal with a spreading code to derive data samples.

11. The apparatus of claim 7 wherein the signal decoder data sample transforming means comprises means for generating soft decision similarity metrics by utilizing a Hadamard transform matrix algorithm on a group of data samples.

12. The apparatus of claim 7 wherein the signal decoder decoding means comprises means for generating at least one estimated data bit by utilizing maximum likelihood decoding techniques which are substantially similar to the Viterbi decoding algorithm.

13. A method of convolutionally encoding data bits of a signal for transmission, comprising:
  (a) convolutionally encoding input data bits of the signal into data symbols, the data symbols being encoded with an encoding algorithm, wherein the encoding algorithm produces data symbols which are subsequently decoded into data signal bits using maximum likelihood decoding, the encoding algorithm comprising implementing at least one generator function having weight spectrum optimized for use in orthogonal coding;
  (b) grouping the data symbols;
  (c) translating the groups of data symbols according to an algorithm selected from the group consisting essentially of (i) interleaving by group each group of data symbols within a predetermined size block and subsequently deriving an orthogonal code from each group of interleaved data symbols and (ii) deriving an orthogonal code from each group of data symbols and subsequently interleaving by orthogonal code each orthogonal code within a predetermined size block; and
  (d) transmitting the translated groups of data symbols over a communication channel.

14. A method of convolutionally encoding data bits of a signal for transmission, comprising:
  (a) convolutionally encoding input data bits of the signal into data symbols, the data symbols being encoded with an encoding algorithm such that the data symbols may be subsequently decoded into data signal bits with maximum likelihood decoding techniques, the encoding algorithm comprising implementing at least one generator function having weight spectrum optimized for use in orthogonal coding;
  (b) grouping the data symbols;
  (c) translating the groups of data symbols according to an algorithm selected from the group consisting essentially of (i) interleaving by group each group of data symbols within a predetermined size block and subsequently deriving an orthogonal code from each group of interleaved data symbols and (ii) deriving an orthogonal code from each group of data symbols and subsequently interleaving by orthogonal code each orthogonal code within a predetermined size block; and
  (d) transmitting the translated groups of data symbols over a communication channel.

15. The method of claim 14 wherein the encoding algorithm comprises a convolutional coding algorithm having at least one generator function selected from the group of generator functions as described in octal form consisting of: 575, 555, 434, 414, 161, 141, 020, 1372, 1332, 1070, 1030, 342, 302, and 040.

16. The method of claim 14 wherein the encoding algorithm comprises a convolutional coding algorithm having a set of six generator functions selected from the group of sets of generator functions g(x) as described in octal form consisting of:
 (a) g1(x)=555, g2(x)=434, g3(x)=141, g4(x)=1332, g5(x)=1070, and g6(x)=302;
 (b) g1(x)=575, g2(x)=414, g3(x)=020, g4(x)=1372, g5(x)=1030, and g6(x)=040; and
 (c) g1(x)=434, g2(x)=161, g3(x)=141, g4(x)=1070, g5(x)=342, and g6(x)=302.

17. The method of claim 14 further comprising the step of, prior to the step of transmitting, preparing the translated groups of data symbols for transmission over the communication channel by spreading the translated groups of data symbols with a spreading code.

18. The method of claim 14 further comprising the steps of:
 (a) sampling a signal received from over a communication channel into data samples;
 (b) grouping the data samples;
 (c) transforming the groups of data samples according to an algorithm selected from the group consisting essentially of (i) generating a plurality of soft decision similarity metrics and index data symbols for each group of data samples such that one index data symbol is associated with each soft decision metric and subsequently deinterleaving by group each group of soft decision metrics within a predetermined size block and (ii) deinterleaving by group each group of data samples within a predetermined size block and subsequently generating a plurality of soft decision similarity metrics and index data symbols for each deinterleaved group of data samples such that one index data symbol is assoicated with each soft decision metric, each soft decision metric corresponding to a measure of confidence that a particular group of data samples is substantially similar to a particular orthogonal code from within a set of mutually orthogonal codes; and
 (d) generating at least one estimated data bit by utilizing maximum likelihood decoding techniques to derive the at least one estimated data bit from the index data symbols and associated deinterleaved soft decision metrics.

19. The method of claim 18 wherein the step of:
 (a) encoding comprises convolutionally encoding two input data bits of the signal into six data symbols and grouping the six data symbols derived from the two input data bits;
 (b) translating comprises translating the groups of data symbols according to an algorithm selected from the group consisting essentially of (i) interleaving as a group each group of six data symbols within the predetermined size block and subsequently deriving a 64 bit length orthogonal code from each group of six data symbols and (ii) deriving a 64 bit length orthohonal code from each group of six data symbols and subsequently interleaving as a group each 64 bit length orthogonal code within the predetermined size block;
 (c) transmitting comprises spreading each 64 bit length orthogonal code with a predetermined spreading code such that 256 bit length sequences are formed which represent each 64 bit length orthogonal code and subsequently transmitting the 256 bit length sequences over the communication channel whereby each two input data bits are represented by a 256 bit length transmitted sequence;
 (d) sampling comprises despreading the received signal with the predetermined spreading code to derive data samples such that each data sample represents a 4 bit length sequence of the received signal;
 (e) grouping comprises grouping the data samples into 64 bit length groups;
 (f) transforming comprises transforming the groups of data samples according to an algorithm selected from the groups consisting essentially of (i) generating 64 soft decision metrics and index data symbols for each 64 bit length group of data samples such that one index data symbol having at least a 6 bit length is associated with each soft decision metric and subsequently deinterleaving as a group each group of 64 soft decision metrics within the predetermined size block and (ii) deinterleaving as a group each 64 bit length group of data samples within the predetermined size block and subsequently generating 64 soft decision metrics and index data symbols for each deinterleaved 64 bit length group of data samples such that one index data symbol having at least a 6 bit length is associated with each soft decision metric, each soft decision metric corresponding to a measure of confidence that a particular group of data symbols is substantially similar to a particular 64 bit length orthogonal code from within a set of 64 mutually orthogonal 64 bit length codes; and
 (g) generating comprises generating at least one estimated data bit by utilizing maximum likelihood decoding techniques including using the at least 6 bit length index data symbols and associated soft decision metrics.

20. The method of claim 18 wherein the predetermined block size is derived from the number of soft decision metrics generated for each group of data samples, the number of data samples in each group of data samples and the maximum number of data samples which can be sampled from a received signal transmission block.

21. The method of claim 18 wherein the step of sampling comprises despreading the received signal with a spreading code to derive data samples.

22. The method of claim 18 wherein the step of transforming comprises generating soft decision similarity metrics by utilizing a Hadamard transform matrix algorithm on a group of data samples.

23. The method of claim 18 wherein the step of decoding comprises generating at least one estimated data bit by utilizing maximum likelihood decoding techniques which are substantially similar to the Viterbi decoding algorithm.

24. The method of claim 18 wherein:
 (a) each algorithm of the step of transforming comprises:
  (i) determining each index data symbol such that each index data symbol corresponds to a possible transition within a maximum likelihood decoding trellis; and
  (ii) storing each generated soft decision metric in a particular address of a memory based lookup table such that the associated index data symbol comprises a portion of the particular address in the lookup table; and (b) the step of generating comprises generating at least one estimated data bit by utilizing maximum likelihood decoding techniques in which such transition corresponding index data symbols are used to address and retrieve at least one soft decision metric from the memory based lookup table.

25. The method of claim 18 wherein the commumication channel is selected from the group consisting essentially of an electronic data bus, radio communication link, wireline and optical fiber link.

* * * * *

UNITED STATES PATENT AND TRADEMARK OFFICE
CERTIFICATE OF CORRECTION

PATENT NO. : 5,204,874

DATED : April 20, 1993

INVENTOR(S) : Falconer et al.

It is certified that error appears in the above-identified patent and that said Letters Patent is hereby corrected as shown below:

After the title and before "FIELD OF THE INVENTION", please insert --This is a continuation-in-part of application Serial No. 07/751,372 filed 8/28/91.--

Signed and Sealed this

Fifteenth Day of March, 1994

Attest:

BRUCE LEHMAN

*Attesting Officer*  *Commissioner of Patents and Trademarks*